US009935111B2

(12) United States Patent
Kim et al.

(10) Patent No.: US 9,935,111 B2
(45) Date of Patent: Apr. 3, 2018

(54) METHOD OF FORMING SEMICONDUCTOR DEVICE INCLUDING EDGE CHIP AND RELATED DEVICE

(71) Applicant: Samsung Electronics Co., Ltd., Suwon-si, Gyeonggi-do (KR)

(72) Inventors: Eunjung Kim, Daegu (KR); Sohyun Park, Seoul (KR); Bong-Soo Kim, Yongin-si (KR); Yoosang Hwang, Suwon-si (KR); Dong-Wan Kim, Hwaseong-si (KR); Junghoon Han, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/631,105

(22) Filed: Jun. 23, 2017

(65) Prior Publication Data

US 2017/0294440 A1 Oct. 12, 2017

Related U.S. Application Data

(62) Division of application No. 15/148,405, filed on May 6, 2016, now Pat. No. 9,761,591.

(30) Foreign Application Priority Data

Sep. 8, 2015 (KR) .................. 10-2015-0126949

(51) Int. Cl.
*H01L 21/20* (2006.01)
*H01L 27/108* (2006.01)

(52) U.S. Cl.
CPC .. *H01L 27/10894* (2013.01); *H01L 27/10814* (2013.01); *H01L 27/10823* (2013.01); *H01L 27/10897* (2013.01)

(58) Field of Classification Search
CPC ................ H01L 27/10894; H01L 27/10814
(Continued)

(56) References Cited

U.S. PATENT DOCUMENTS 5,217,916 A * 6/1993 Anderson ............. H01L 27/118
257/909
5,459,340 A * 10/1995 Anderson ............. H01L 27/118
257/203
(Continued)

FOREIGN PATENT DOCUMENTS

KR 10-2001-0064054 7/2001
KR 10-0316016 11/2001
(Continued)

*Primary Examiner* — Caleb Henry
(74) *Attorney, Agent, or Firm* — Harness, Dickey & Pierce, P.L.C.

(57) ABSTRACT

A method of forming a semiconductor device includes forming a molding layer and a supporter layer on a substrate including an etch stop layer, forming a mask layer on the supporter layer, forming a first edge blocking layer on the mask layer, forming a mask pattern by etching the mask layer, forming a hole, forming a lower electrode in the hole, forming a supporter mask layer on the supporter layer, forming a second edge blocking layer on the supporter mask layer, forming a supporter mask pattern by patterning the supporter mask layer, forming a supporter opening passing through the supporter layer, removing the molding layer, forming a capacitor dielectric layer and an upper electrode on the lower electrode, forming an interlayer insulating layer on the upper electrode, and planarizing the interlayer insulating layer. The hole passes through the supporter layer, the molding layer and the etch stop layer.

9 Claims, 37 Drawing Sheets

(58) Field of Classification Search
USPC .......................................................... 438/396
See application file for complete search history.

(56) References Cited

U.S. PATENT DOCUMENTS

| | | | |
|---|---|---|---|
| 6,607,954 B2 | 8/2003 | Jeon et al. | |
| 6,784,051 B2 | 8/2004 | Lee | |
| 7,101,752 B2 | 9/2006 | Park et al. | |
| 7,598,180 B2* | 10/2009 | Park | H01L 27/10894 |
| | | | 257/E21.17 |
| 8,609,543 B2 | 12/2013 | Kim et al. | |
| 8,614,509 B2 | 12/2013 | Kim | |
| 8,785,328 B2 | 7/2014 | Sun et al. | |
| 8,809,929 B2 | 8/2014 | Park et al. | |
| 8,846,305 B2 | 9/2014 | Kim et al. | |
| 8,999,777 B2 | 4/2015 | Liu et al. | |
| 9,761,591 B2* | 9/2017 | Kim | H01L 27/10852 |
| 2002/0187598 A1 | 12/2002 | Park et al. | |
| 2004/0191927 A1 | 9/2004 | Park et al. | |
| 2006/0157752 A1* | 7/2006 | Suzuki | H01L 21/823814 |
| | | | 257/288 |
| 2006/0244032 A1 | 11/2006 | Park et al. | |
| 2014/0045320 A1* | 2/2014 | Uchiyama | G03F 9/7076 |
| | | | 438/462 |
| 2015/0004771 A1 | 1/2015 | Kang | |
| 2015/0091127 A1 | 4/2015 | Lee et al. | |
| 2017/0069633 A1* | 3/2017 | Kim | H01L 27/10852 |

FOREIGN PATENT DOCUMENTS

| | | |
|---|---|---|
| KR | 10-2004-0048491 | 6/2004 |
| KR | 10-0546162 B1 | 1/2006 |
| KR | 10-2007-0002547 | 1/2007 |
| KR | 10-0687871 B1 | 2/2007 |
| KR | 2007-0071613 A | 7/2007 |
| KR | 10-0811261 B1 | 3/2008 |
| KR | 2010-0005601 A | 1/2010 |
| KR | 10-1051159 B1 | 7/2011 |
| KR | 2012-0096697 A | 8/2012 |

* cited by examiner

METHOD OF FORMING SEMICONDUCTOR DEVICE INCLUDING EDGE CHIP AND RELATED DEVICE

CROSS-REFERENCE TO RELATED APPLICATION

This application in a divisional of U.S. application Ser. No. 15/148,405, filed on May 6, 2016, which claims priority under 35 U.S.C. § 119 to Korean Patent Application No. 10-2015-0126949 filed on Sep. 8, 2015, the entire contents of each of the above-referenced applications are hereby incorporated by reference.

BACKGROUND

Field

Example embodiments of inventive concepts relate to a method of forming a semiconductor device including an edge chip.

Description of Related Art

Various methods for limiting (and/or preventing) a pattern from being formed on an edge chip are being attempted. The pattern formed on the edge chip has a characteristic vulnerable to damage. The damage of the pattern causes a failure of a main chip. When a recessed region is formed by etching a region in which the pattern is formed, a surface step between the edge chip and the main chip may be increased. The surface step between the edge chip and the main chip makes planarization difficult.

SUMMARY

Example embodiments of inventive concepts provide a method of forming a semiconductor device in which a stepped surface is minimized while a pattern is limited (and/or prevented) from being formed on an edge chip.

Example embodiments of inventive concepts relate to a semiconductor device having an excellent electrical characteristic.

The technical features of inventive concepts are not limited to the above disclosure; other objectives may become apparent to those of ordinary skill in the art based on the following descriptions.

In accordance with example embodiments of inventive concepts, a method of forming a semiconductor device is provided. The method includes forming a molding layer and a supporter layer on a substrate including an etch stop layer. The substrate includes a main chip and an edge chip. The edge chip is nearer an edge of the substrate than the main chip. The main chip includes a first cell region and a first peripheral region. The edge chip includes a second cell region and a second peripheral region. A mask layer is formed on the supporter layer. A first edge blocking layer is formed on the mask layer. The first edge blocking layer covers the second cell region and the second peripheral region. A mask pattern is formed on the substrate. The forming the mask pattern includes etching the mask layer. A hole passing through the supporter layer, the molding layer and the etch stop layer is formed using the mask pattern as an etching mask. The hole is formed on the first cell region. The hole is not formed on the first peripheral region, the second cell region, and the second peripheral region. A lower electrode is formed in the hole. An upper surface of the supporter layer is exposed. Upper ends of the supporter layer and the hole on the first cell region, an upper end of the supporter layer on the first peripheral region, an upper end of the supporter layer on the second cell region, and an upper end of the supporter layer on the second peripheral region are formed at substantially the same level. A supporter mask layer is formed on the supporter layer. A second edge blocking layer is formed on the supporter mask layer. A supporter mask pattern is formed by patterning the supporter mask layer. A supporter opening passing through the supporter layer is formed. The molding layer is removed. A capacitor dielectric layer is formed on the lower electrode. An upper electrode is formed on the capacitor dielectric layer. An interlayer insulating layer is formed on the upper electrode. The interlayer insulating layer is planarized.

In example embodiments, the first edge blocking layer and the second edge blocking layer each may include a negative photoresist.

In example embodiments, the formation of the mask pattern may include forming a first preliminary mask pattern on the mask layer over the first cell region and the second cell region. A second preliminary mask layer may be formed on the first preliminary mask pattern. The second preliminary mask layer may cover an entire surface of the substrate. The first edge blocking layer may be formed. A trim pattern may be formed on the second preliminary mask layer and the first edge blocking layer. The trim pattern may cover edges of the first cell region and the second cell region, and the trim pattern may cover the first peripheral region and the second peripheral region. A second preliminary mask pattern that crosses the first preliminary mask pattern may be formed on the first cell region. The forming the second preliminary mask pattern may include etching the second preliminary mask layer. The mask layer may be etched using the second preliminary mask pattern and the first preliminary mask pattern as etching masks.

In example embodiments, the forming the first preliminary mask pattern may include forming a first sacrificial pattern on the mask layer, forming a first preliminary mask layer that covers an upper portion and side surfaces of the first sacrificial pattern, anisotropically etching the first preliminary mask layer, and removing the first sacrificial pattern over the first cell region.

In example embodiments, the forming the second preliminary mask pattern may include forming a second sacrificial pattern that crosses the first preliminary mask pattern, forming the second preliminary mask layer that covers an upper portion and side surfaces of the second sacrificial pattern, anisotropically etching the second preliminary mask layer, and removing the second sacrificial pattern over the first cell region.

In example embodiments, the second preliminary mask layer may cover the first cell region, the first peripheral region, the second cell region, and the second peripheral region. The first edge blocking layer may cover the second cell region and the second peripheral region.

In example embodiments, the second edge blocking layer may cover the second cell region. The second edge blocking layer may expose upper portions of the first cell region, the first peripheral region, and the second peripheral region.

In example embodiments, before the formation of the capacitor dielectric layer, the method may further include exposing the etch stop layer, the lower electrode, and the supporter layer on the first cell region; exposing the etch stop layer on the first peripheral region; exposing the supporter layer on the second cell region such that the molding layer may remain between the supporter layer and the etch stop layer on the second cell region; and exposing the etch stop layer on the second peripheral region.

In example embodiments, the second edge blocking layer may cover the second cell region and the second peripheral region. The second edge blocking layer may expose upper portions of the first cell region and the first peripheral region.

In example embodiments, before the formation of the capacitor dielectric layer, the method may further include exposing the etch stop layer, the lower electrode, and the supporter layer on the first cell region; exposing the etch stop layer on the first peripheral region; exposing the supporter layer on the second cell region such that the molding layer may remain between the supporter layer and the etch stop layer on the second cell region; exposing the etch stop layer on the second peripheral region; and exposing the supporter layer on the second peripheral region such that the molding layer may remain between the supporter layer and the etch stop layer on the second peripheral region.

In accordance with example embodiments of inventive concepts, a method of forming a semiconductor device is provided. The method includes forming a molding layer and a supporter layer on a substrate including an etch stop layer. The substrate includes a main chip and an edge chip. The edge chip is nearer an edge of the substrate than the main chip. The main chip includes a first cell region and a first peripheral region. The edge chip includes a second cell region and a second peripheral region. A hole passing through the supporter layer, the molding layer and the etch stop layer is formed. The hole is formed on the first cell region. The hole is not formed on the first peripheral region, the second cell region, and the second peripheral region. A lower electrode is formed in the hole. An upper surface of the supporter layer is exposed such that upper ends of the supporter layer and the hole on the first cell region, an upper end of the supporter layer on the first peripheral region, an upper end of the supporter layer on the second cell region, and an upper end of the supporter layer on the second peripheral region are formed at substantially the same level. A supporter mask layer is formed on the supporter layer. An edge blocking layer is formed on the supporter mask layer. A supporter mask pattern is formed by patterning the supporter mask layer. A supporter opening passing through the supporter layer is formed. The molding layer is removed. A capacitor dielectric layer is formed on the lower electrode. An upper electrode is formed on the substrate including capacitor dielectric layer. An interlayer insulating layer is formed on the upper electrode. The interlayer insulating layer is planarized.

In example embodiments, the forming the edge blocking layer may include using a reticle having a light projection pattern corresponding to the second cell region and a light shielding pattern corresponding to the second peripheral region.

In example embodiments, before the planarizing the interlayer insulating layer, upper ends of the interlayer insulating layer on the first cell region and the second cell region may be formed at substantially the same level, upper ends of the interlayer insulating layer on the first peripheral region and the second peripheral region may be formed at substantially the same level, and the upper ends of the interlayer insulating layer on the first cell region and the second cell region may be formed at a higher level than the upper ends of the interlayer insulating layer on the first peripheral region and the second peripheral region.

In example embodiments, the forming the edge blocking layer may include using a reticle having a light projection pattern corresponding to the second cell region and the second peripheral region.

In example embodiments, the interlayer insulating layer on the second peripheral region may be etched and recessed before the planarizing of the interlayer insulating layer. An upper surface of the recessed interlayer insulating layer may be formed at substantially the same level as an upper surface of the interlayer insulating layer on the first peripheral region.

According to example embodiments of inventive concepts, a method of forming a semiconductor device is provided. The method includes forming a molding layer and a supporter layer on a substrate having an etch stop layer. The substrate includes a main chip and an edge chip that is nearer an edge of the substrate than the main chip. The main chip includes a first cell region and a first peripheral region. The edge chip includes a second cell region and a second peripheral region. A mask layer is formed on the supporter layer. A first preliminary mask pattern is formed on the mask layer formed on the first cell region and the second cell region. A second preliminary mask layer is formed on the first preliminary mask pattern. The second preliminary mask layer covers an entire surface of the substrate. An edge blocking layer that covers the second preliminary mask layer on the second cell region and the second peripheral region is formed. A trim pattern is formed on the second preliminary mask layer and the edge blocking layer. The trim pattern covers edges of the first cell region and the second cell region, and the trim pattern covers the first peripheral region and the second peripheral region. A second preliminary mask pattern that crosses the first preliminary mask pattern is formed on the first cell region. The forming the second preliminary mask pattern includes etching the second preliminary mask layer. A mask pattern is formed on the substrate. The forming the mask pattern includes etching the mask layer using the second preliminary mask pattern and the first preliminary mask pattern as etching masks. A hole passing through the supporter layer, the molding layer, and the etch stop layer is formed using the mask pattern as an etching mask. The hole is formed on the first cell region. The hole is not formed on the first peripheral region, the second cell region, and the second peripheral region. A lower electrode is formed in the hole. An upper surface of the supporter layer is exposed such that upper ends of the supporter layer and the hole on the first cell region, an upper end of the supporter layer on the first peripheral region, an upper end of the supporter layer on the second cell region, and an upper end of the supporter layer on the second peripheral region are formed at substantially the same level.

Furthermore, according to example embodiments of inventive concepts, a semiconductor device is provided. The device includes a substrate including a main chip and an edge chip. The edge chip is nearer an edge of the substrate than the main chip. The main chip includes a first cell region and a first peripheral region. The edge chip includes a second cell region and a second peripheral region. Landing pads are on the substrate. An etch stop layer is on the landing pads. A supporter layer is on the etch stop layer. A lower electrode passes through the supporter layer and the etch stop layer. The lower electrode layer contacts the landing pads. A molding layer is between the etch stop layer and the supporter layer. A capacitor dielectric layer is on the lower electrode. An upper electrode is on the capacitor dielectric layer. An interlayer insulating layer covers the etch stop layer and the upper electrode. The lower electrode is on the first cell region. The lower electrode is not formed on the second cell region and the second peripheral region. The molding layer is not formed on the first cell region and the first peripheral region. The supporter layer is not formed on the first peripheral region.

In example embodiments, a lower surface of the interlayer insulating layer on the first cell region and a lower surface of the interlayer insulating layer on the second cell region may be formed at substantially the same level.

In example embodiments, the upper electrode may remain on the supporter layer over the second cell region. An upper surface of the upper electrode on the second cell region may be formed at substantially the same level as an upper surface of the upper electrode on the first cell region.

In example embodiments, the supporter layer may be on the first cell region and the second cell region. The molding layer may be between the etch stop layer and the supporter layer on the second cell region. The molding layer and the supporter layer may not be formed on the second peripheral region.

In example embodiments, the interlayer insulating layer on the first peripheral region may directly contact the etch stop layer. The interlayer insulating layer on the second peripheral region may directly contact the etch stop layer. A lower surface of the interlayer insulating layer on the first peripheral region and a lower surface of the interlayer insulating layer on the second peripheral region may be formed at substantially the same level.

In example embodiments, the supporter layer may be on the first cell region, the second cell region, and the second peripheral region. The molding layer may be between the etch stop layer and the supporter layer on the second cell region. The molding layer may be between the etch stop layer and the supporter layer on the second peripheral region.

In example embodiments, the interlayer insulating layer on the first peripheral region may directly contact the etch stop layer. The interlayer insulating layer on the second peripheral region may directly contact the supporter layer. A lower surface of the interlayer insulating layer on the second peripheral region may be formed at a higher level than a lower surface of the interlayer insulating layer on the first peripheral region.

In example embodiments, the supporter layer may directly contact the lower electrode. The upper electrode may extend between the supporter layer and the interlayer insulating layer. The capacitor dielectric layer may be between the upper electrode and the lower electrode. The capacitor dielectric layer may be between the upper electrode and the supporter layer.

In example embodiments, the supporter layer may include a top supporter layer and a middle supporter layer. The middle supporter layer may be between the top supporter layer and the etch stop layer. The capacitor dielectric layer may be in contact with an upper surface of the top supporter layer and a lower surface of the top supporter layer. The capacitor dielectric layer may be in contact with an upper surface of the middle supporter layer and a lower surface of the middle supporter layer. The capacitor dielectric layer may be in contact with an upper surface of the etch stop layer.

According to example embodiments of inventive concepts, A method of forming a semiconductor device includes: forming a mask layer on a supporter layer, the supporter layer being on a substrate, the substrate including a main chip and an edge chip, the edge chip being nearer an edge of the substrate than the main chip, the main chip including a first cell region and a first peripheral region, and the edge chip including a second cell region and a second peripheral region; forming a first preliminary mask pattern on the mask layer over the first cell region and the second cell region; forming a second preliminary mask layer on the first preliminary mask pattern, the second preliminary mask layer on the mask layer over the first cell region, the first peripheral region, the second cell region, and the second peripheral region; forming an edge blocking layer covering the second preliminary mask layer over the second cell region and the second peripheral region; forming a second preliminary mask pattern that crosses the first preliminary mask pattern on the first cell region, the forming the second preliminary mask pattern including etching the second preliminary mask layer; forming a mask pattern on the substrate, the forming the mask pattern including etching the mask layer using the second preliminary mask pattern and the first preliminary mask pattern as etching masks; forming a hole passing through the supporter layer using the mask pattern as an etching mask, the hole being formed on the first cell region, and the hole not being formed on the first peripheral region, the second cell region, and the second peripheral region; forming a lower electrode in the hole; and exposing an upper surface of the supporter layer such that upper ends of the supporter layer and the hole on the first cell region, an upper end of the supporter layer on the first peripheral region, an upper end of the supporter layer on the second cell region, and an upper end of the supporter layer on the second peripheral region are formed at substantially the same level.

In example embodiments, the forming the mask layer may include forming the mask layer on an etch stop layer and a molding layer on the substrate. The supporter layer may be on the etch stop layer. The molding layer may be on etch stop layer, and the forming the hole passing through the supporter layer may include forming the hole passing through the etch stop layer.

In example embodiments, the method may further include: forming a supporter mask layer on the supporter layer; forming a second edge blocking layer on the supporter mask layer; patterning the supporter mask layer, the patterning the supporter mask layer including forming a supporter mask pattern; forming a supporter opening through the supporter layer; removing the molding layer; forming a capacitor dielectric layer on the lower electrode; forming an upper electrode on the capacitor dielectric layer; forming an interlayer insulating layer on the upper electrode; and planarizing the interlayer insulating layer.

In example embodiments, the first edge blocking layer and the second edge blocking layer each include a negative photoresist.

In example embodiments, before the forming the capacitor dielectric layer, the method may further include: exposing the etch stop layer, the lower electrode, and the supporter layer on the first cell region; exposing the etch stop layer on the first peripheral region; and exposing the supporter layer on the second cell region such that the molding layer remains between the supporter layer and the etch stop layer on the second cell region.

Details of other example embodiments are included in detailed descriptions and the drawings.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF EXAMPLE EMBODIMENTS

Figure 1:
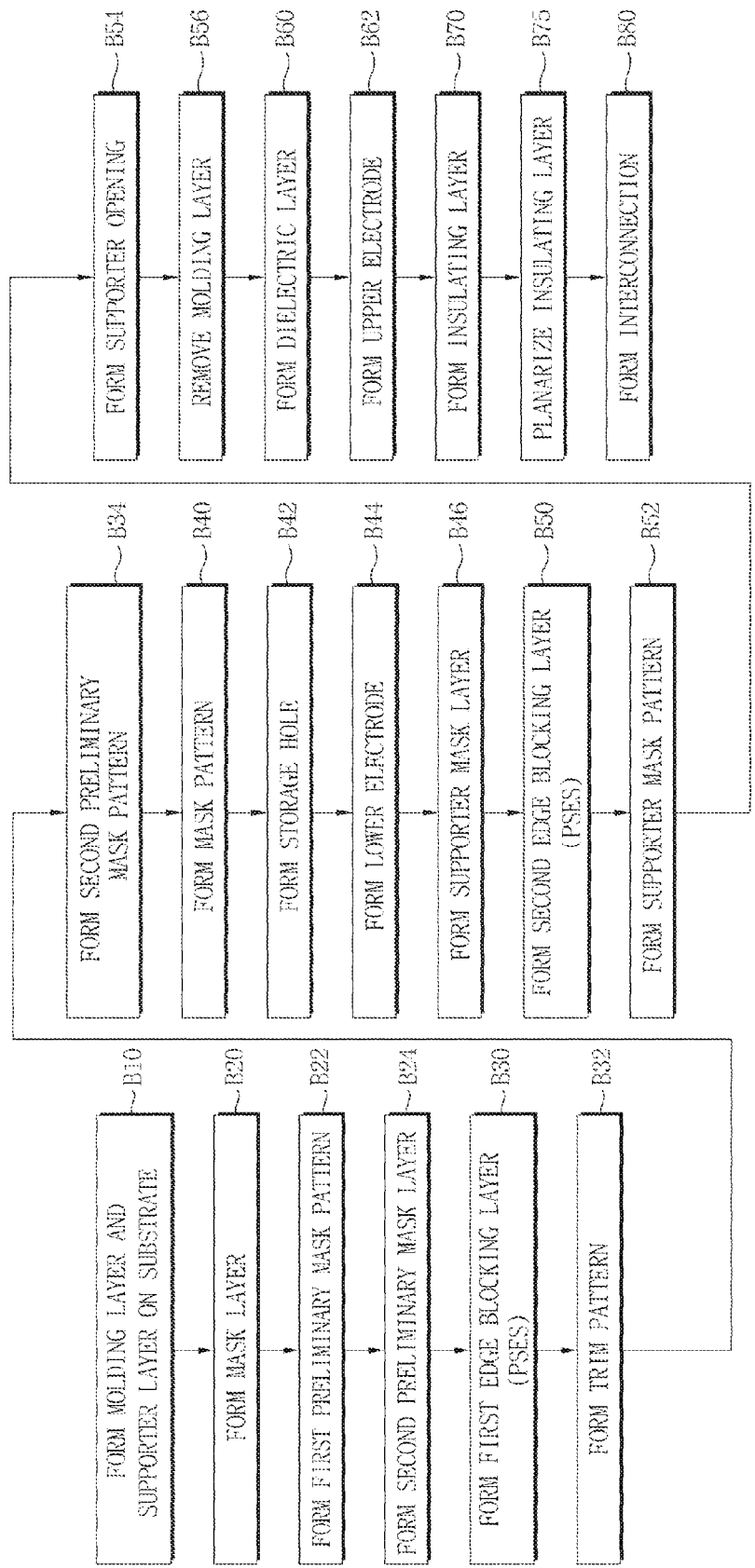
FIG. 1 is a flowchart for describing a method of forming a semiconductor device in accordance with example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

The terminology used herein is for the purpose of describing particular embodiments only and is not intended to be limiting of example embodiments of inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. Like reference numerals throughout this specification denote like elements. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another/other element(s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of being above and below. The device may be otherwise oriented (rotated 90 degrees or at other orientations) and the spatially relative descriptors used herein may be interpreted accordingly.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Terms such as "front side," and "back side" may be used in a relative sense herein to facilitate easy understanding of inventive concepts. Accordingly, "front side," and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side," and "back side" cannot be used interchangeably in the same embodiment.

The term "near" is intended to mean that one among two or more features and/or components are located within relatively close proximity of a certain other feature or component. For example, it should be understood that when a first end is near a first side, the first end may be closer to the first side than a second end, or the first end may be closer to the first side than to a second side.

Figure 2:
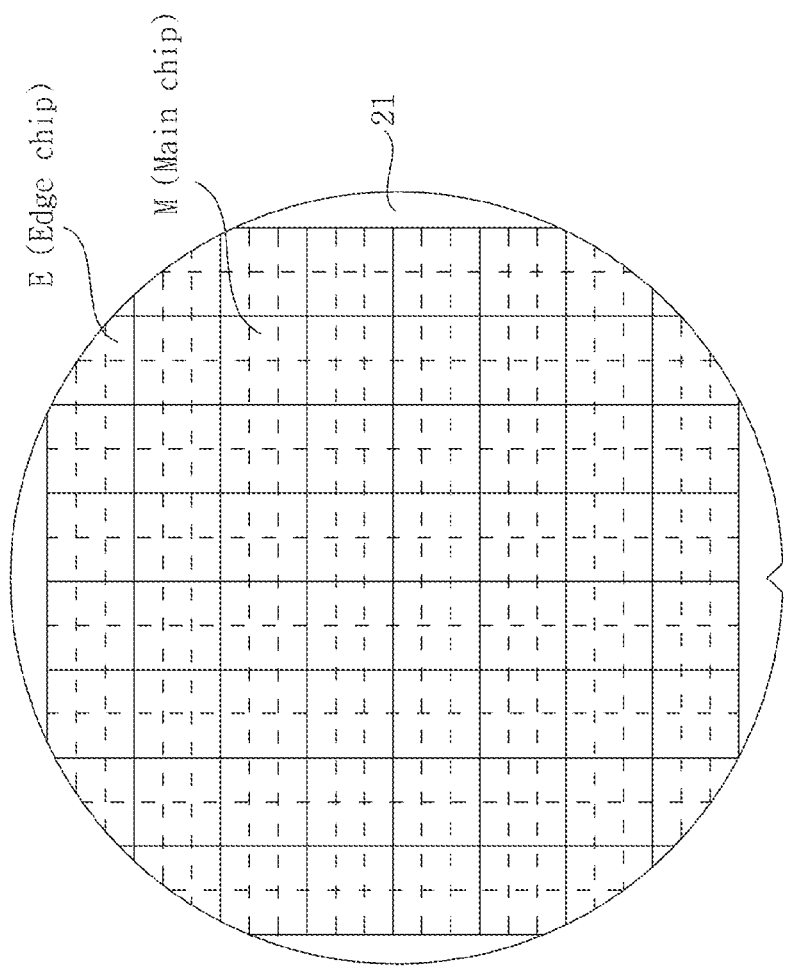
FIGS. 2 and 24 are layouts for describing the method of forming a semiconductor device in accordance with example embodiments of inventive concepts.

FIG. 1 is a flowchart for describing a method of forming a semiconductor device in accordance with example embodiments of inventive concepts. FIGS. 2 and 24 are layouts for describing the method of forming the semiconductor device in accordance with example embodiments of inventive concepts. FIGS. 3 to 23 and 25 to 31 are perspective views for describing the method of forming the semiconductor device in accordance with example embodiments of inventive concepts.

Referring to FIG. 1, the method of forming the semiconductor device in accordance with example embodiments of inventive concepts may include forming a molding layer and a supporter layer on a substrate (B10), forming a mask layer (B20), forming a first preliminary mask pattern (B22), forming a second preliminary mask layer (B24), forming a first edge blocking layer (B30), forming a trim pattern (B32), forming a second preliminary mask pattern (B34), forming a mask pattern (B40), forming a storage hole (B42), forming a lower electrode (B44), forming a supporter mask layer (B46), forming a second edge blocking layer (B50), forming a supporter mask pattern (B52), forming a supporter opening (B54), removing the molding layer (B56), forming a dielectric layer (B60), forming an upper electrode (B62), forming an insulating layer (B70), planarizing the insulating layer (B75), and forming an interconnection (B80).

The forming of the first edge blocking layer (B30) may be interpreted as a first photo sensitive edge stop (PSES) process. The forming of the second edge blocking layer (B50) may be interpreted as a second PSES process.

Referring to FIG. 2, main chips M and edge chips E may be formed on a substrate 21. The edge chips E may be adjacent to edges of the substrate 21. The main chips M may be formed on inner sides away from the edges of the substrate 21. The edge chips E may be formed outside of the main chips M. The substrate 21 may be a semiconductor substrate such as a silicon wafer or a silicon on insulator (SOI) wafer.

Figure 3:
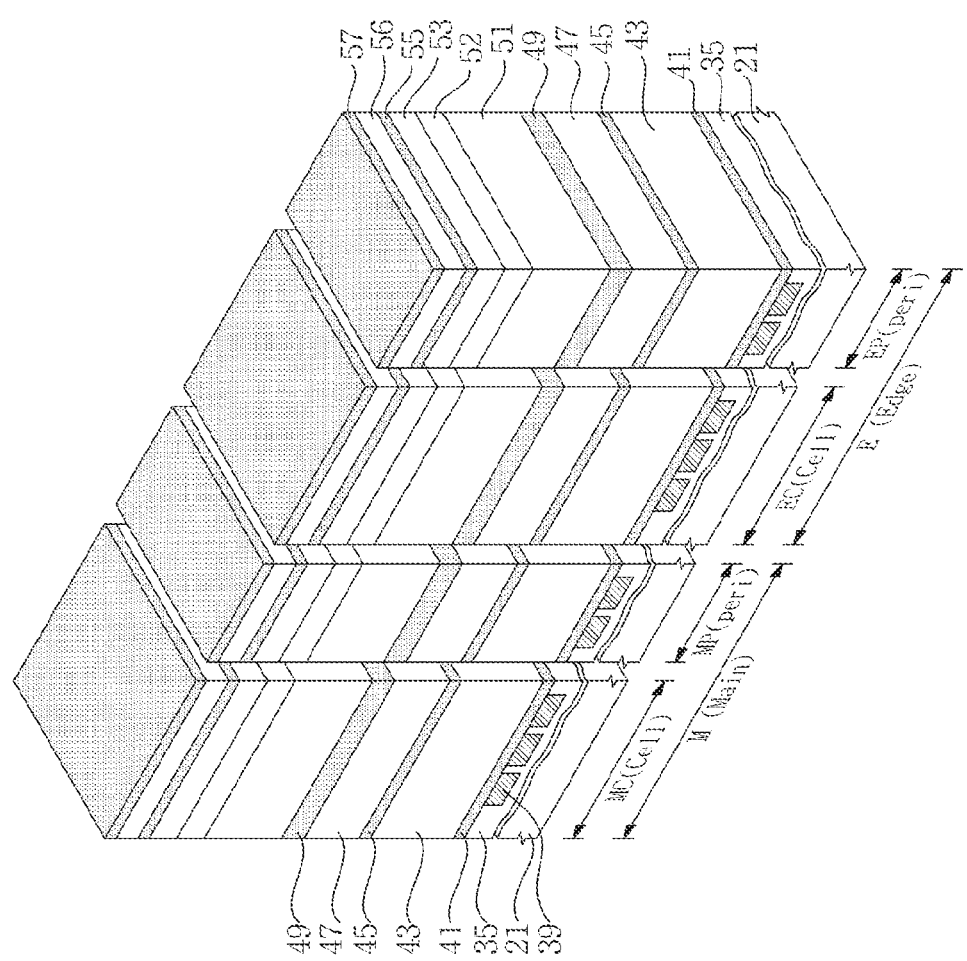
FIGS. 3 to 23 and 25 to 31 are perspective views for describing the method of forming a semiconductor device in accordance with example embodiments of inventive concepts.

Referring to FIGS. 1, 2, and 3, each of the main chip M and the edge chip E may include a cell region and a peripheral region. Hereinafter, for a brief description, the cell region of the main chip M is referred to as a first cell region MC, the cell region of the edge chip E is referred to as a second cell region EC, the peripheral region of the main chip M is referred to as a first peripheral region MP, and the peripheral region of the edge chip E is referred to as a second peripheral region EP. The semiconductor device in accordance with example embodiments of inventive concepts may include a dynamic random access memory (DRAM). FIG. 3 is a perspective view partially illustrating the first cell region MC of the main chip M, the first peripheral region MP of the main chip M, the second cell region EC of the edge chip E, and the second peripheral region EP of the edge chip E.

Molding layers 43 and 47 and supporter layers 45 and 49 may be formed on the substrate 21 (B10).

For example, a lower insulating layer 35 may be formed on the substrate 21. Landing pads 39 may be formed in the lower insulating layer 35. An etch stop layer 41 may be formed to cover the landing pads 39 and the lower insulating layer 35. A first molding layer 43 may be formed on the etch stop layer 41. A middle supporter layer 45 may be formed on the first molding layer 43. A second molding layer 47 may be formed on the middle supporter layer 45. A top supporter layer 49 may be formed on the second molding layer 47.

Various types of active/passive devices such as transistors, diodes, and resistors may be formed inside the substrate 21, between the substrate 21 and the lower insulating layer 35, and inside the lower insulating layer 35, but will be omitted for a brief description.

The lower insulating layer 35 may include an insulating layer such as silicon oxide, silicon nitride, silicon oxynitride, or a combination thereof. The landing pads 39 may include a metal, a metal nitride, polysilicon, conductive carbon, or a combination thereof. The landing pads 39 may include W, WN, Ti, TiN, TiAlN, TiCN, Ta, TaN, TaAlN, TaCN, Ru, or a combination thereof. The etch stop layer 41 may include an insulating layer such as silicon oxide, silicon nitride, silicon oxynitride, or a combination thereof. For example, the etch stop layer 41 may include silicon nitride. The lower insulating layer 35, the landing pads 39, and the etch stop layer 41 may cover the first cell region MC, the first peripheral region MP, the second cell region EC, and the second peripheral region EP. Upper surfaces of the lower insulating layer 35 and the landing pads 39 may be substantially coplanar.

The first molding layer 43 may have a greater thickness than the etch stop layer 41. The first molding layer 43 may include silicon oxide. The middle supporter layer 45 may include a material having an etch selectivity with respect to the first molding layer 43. The middle supporter layer 45 may include an insulating layer such as silicon nitride, silicon oxynitride, silicon carbon nitride (SiCN), or a combination thereof. For example, the middle supporter layer 45 may include SiCN. The middle supporter layer 45 may have a smaller thickness than the first molding layer 43. The second molding layer 47 may have a thickness smaller than the first molding layer 43 and greater than the middle supporter layer 45. The second molding layer 47 may include silicon oxide. The top supporter layer 49 may include a material having an etch selectivity with respect to the second molding layer 47 and the first molding layer 43. The top supporter layer 49 may include an insulating layer such as silicon nitride, silicon oxynitride, silicon carbon nitride (SiCN), or a combination thereof. For example, the top supporter layer 49 may include SiN/SiCN. The top supporter layer 49 may have a thickness greater than the middle supporter layer 45 and smaller than the second molding layer 47. The first molding layer 43, the middle supporter layer 45, the second molding layer 47, and the top supporter layer 49 may cover the first cell region MC, the first peripheral region MP, the second cell region EC, and the second peripheral region EP.

A mask layer 51 may be formed (B20).

For example, the mask layer 51 may be formed on the top supporter layer 49. A first auxiliary mask layer 52 may be formed on the mask layer 51. A second auxiliary mask layer 53 may be formed on the first auxiliary mask layer 52. The mask layer 51, the first auxiliary mask layer 52, and the second auxiliary mask layer 53 may cover the first cell region MC, the first peripheral region MP, the second cell region EC, and the second peripheral region EP. The first auxiliary mask layer 52 and the second auxiliary mask layer 53 may be selectively omitted.

The mask layer 51 may include a material having an etch selectivity with respect to the etch stop layer 41, the first molding layer 43, the middle supporter layer 45, the second molding layer 47, and the top supporter layer 49. For example, the mask layer 51 may include polysilicon. The first auxiliary mask layer 52 may include a different material from the mask layer 51. The first auxiliary mask layer 52 may include silicon oxide. For example, the first auxiliary mask layer 52 may include tetraethyl orthosilicate (TEOS). The second auxiliary mask layer 53 may include a spin-on hardmask (SOH) layer.

A first anti-reflective coating layer (ARC) layer 55 may be formed on the second auxiliary mask layer 53. A first sacrificial layer 56 may be formed on the first ARC layer 55. A second ARC layer 57 may be formed on the first sacrificial layer 56. The first ARC layer 55, the first sacrificial layer 56, and the second ARC layer 57 may cover the first cell region MC, the first peripheral region MP, the second cell region EC, and the second peripheral region EP. The first ARC layer 55 may include silicon nitride or silicon oxynitride. For example, the first ARC layer 55 may be silicon oxynitride. The first sacrificial layer 56 may include an SOH layer. The second ARC layer 57 may include silicon nitride or silicon oxynitride. For example, the second ARC layer 57 may be silicon oxynitride. Each of the first ARC layer 55 and the second ARC layer 57 may have a smaller thickness than the first sacrificial layer 56.

Figure 4:
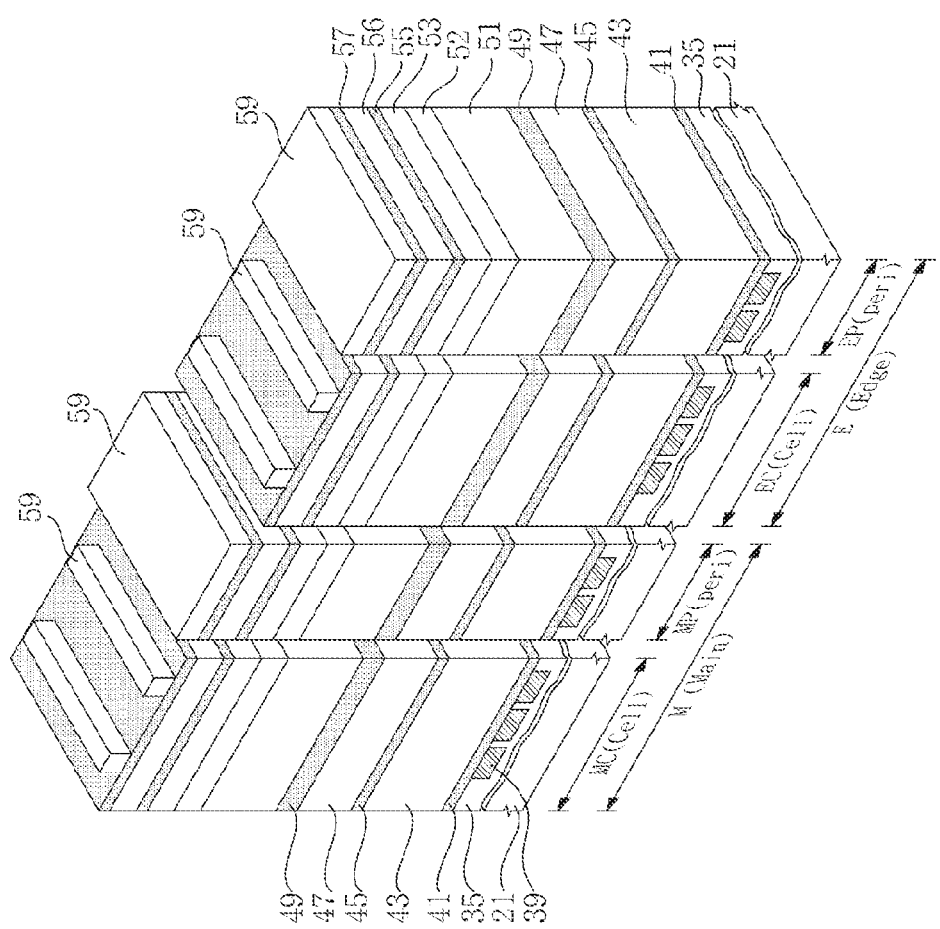

Referring to FIG. 4, first photo mask patterns 59 may be formed. The first photo mask patterns 59 may be formed using a photolithography process. The first photo mask patterns 59 may completely cover the first peripheral region MP and the second peripheral region EP, and partially cover the first cell region MC and the second cell region EC. The first photo mask patterns 59 formed on the first cell region MC and the second cell region EC may have parallel line shapes or parallel bar shapes. On the first cell region MC and the second cell region EC, the second ARC layer 57 may be exposed between the first photo mask patterns 59.

Figure 5:
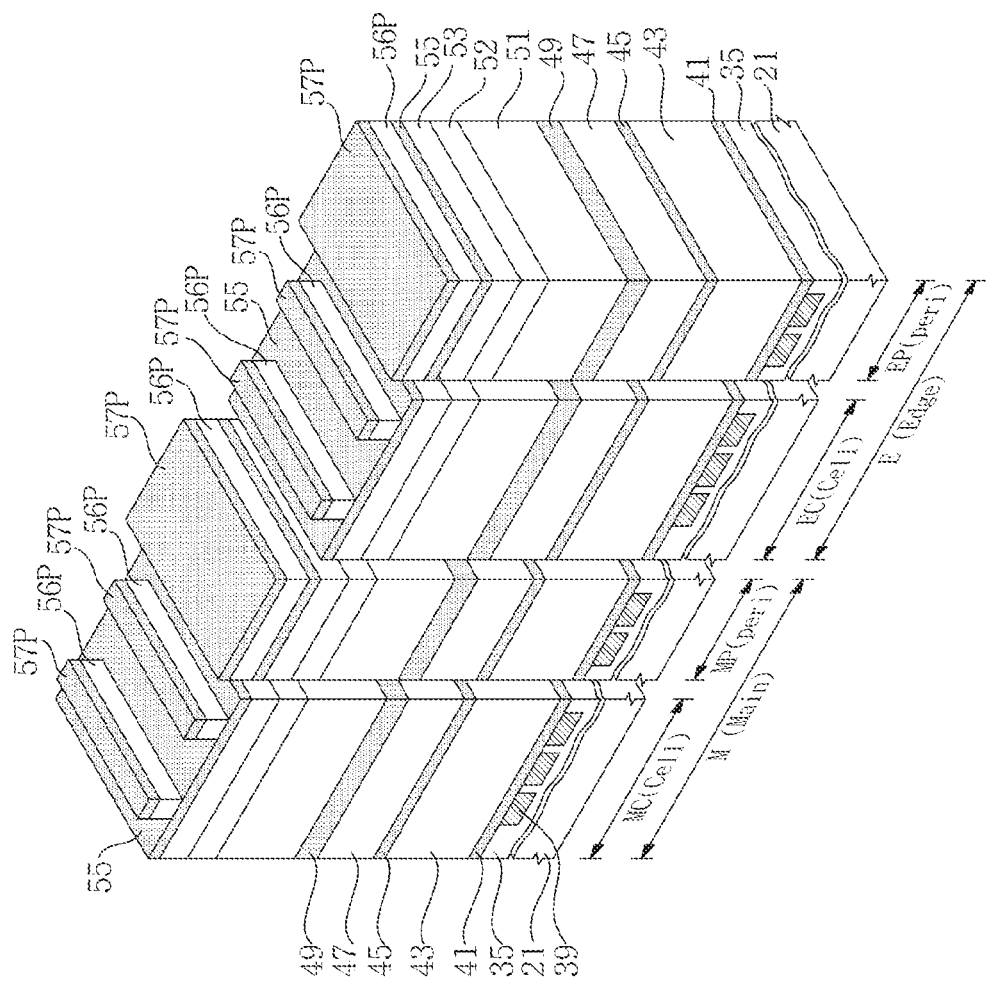

Referring to FIG. 5, second ARC patterns 57P and first sacrificial patterns 56P may be formed by etching the second ARC layer 57 and the first sacrificial layer 56 using the first photo mask patterns 59 as etching masks. The second ARC patterns 57P may remain on the first sacrificial patterns 56P. The second ARC patterns 57P may be exposed by removing the first photo mask patterns 59. The second ARC patterns 57P and the first sacrificial patterns 56P may completely cover the first peripheral region MP and the second peripheral region EP, and partially cover the first cell region MC and the second cell region EC. The second ARC patterns 57P formed on the first cell region MC and the second cell region EC may have parallel line shapes or parallel bar shapes. On the first cell region MC and the second cell region EC, the first ARC layer 55 may be exposed between the first sacrificial patterns 56P.

Figure 6:
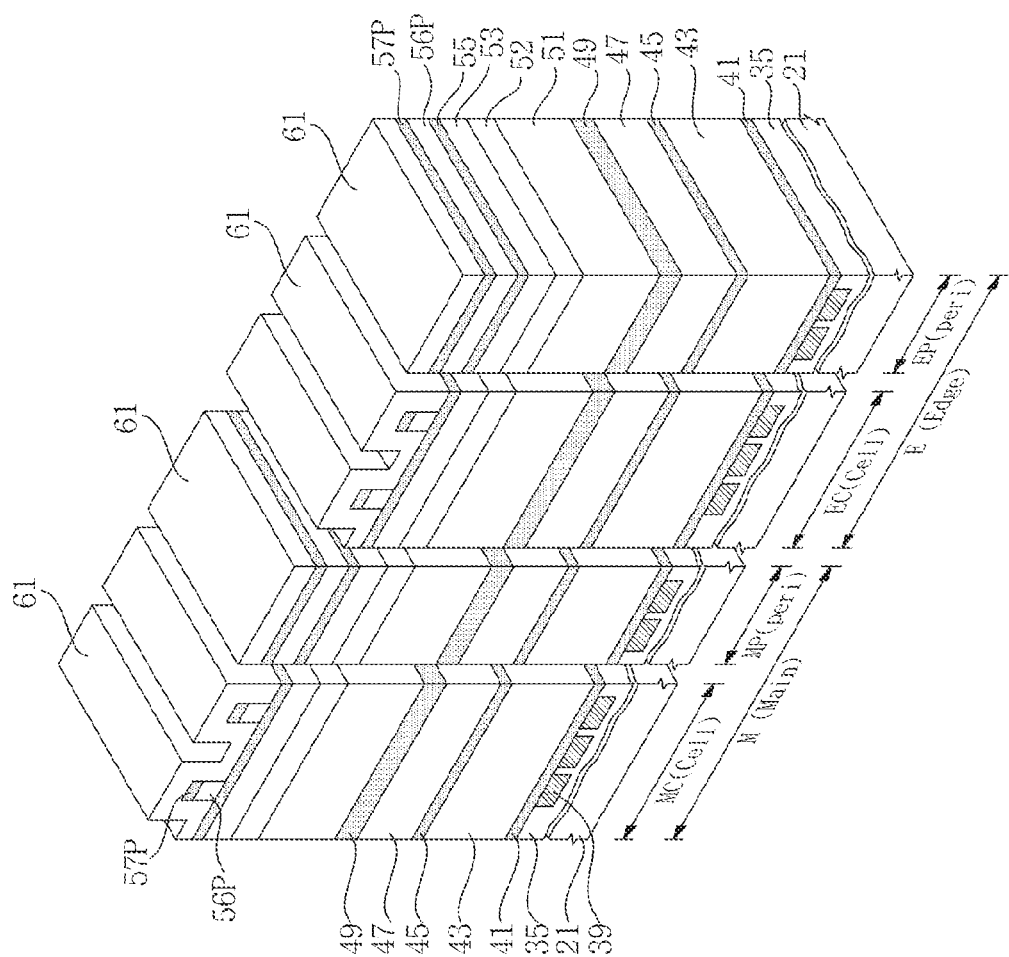

Referring to FIG. 6, a first preliminary mask layer 61 may be formed on the first sacrificial patterns 56P. The first preliminary mask layer 61 may entirely cover the first cell region MC, the first peripheral region MP, the second cell region EC, and the second peripheral region EP. The first preliminary mask layer 61 may include a material having an etch selectivity with respect to the second ARC patterns 57P and the first sacrificial patterns 56P. The first preliminary mask layer 61 may include an atomic layer deposition (ALD) oxide layer. The first preliminary mask layer 61 may cover upper portions and the side surfaces of the second ARC patterns 57P and the first sacrificial patterns 56P to have a uniform thickness.

Figure 7:
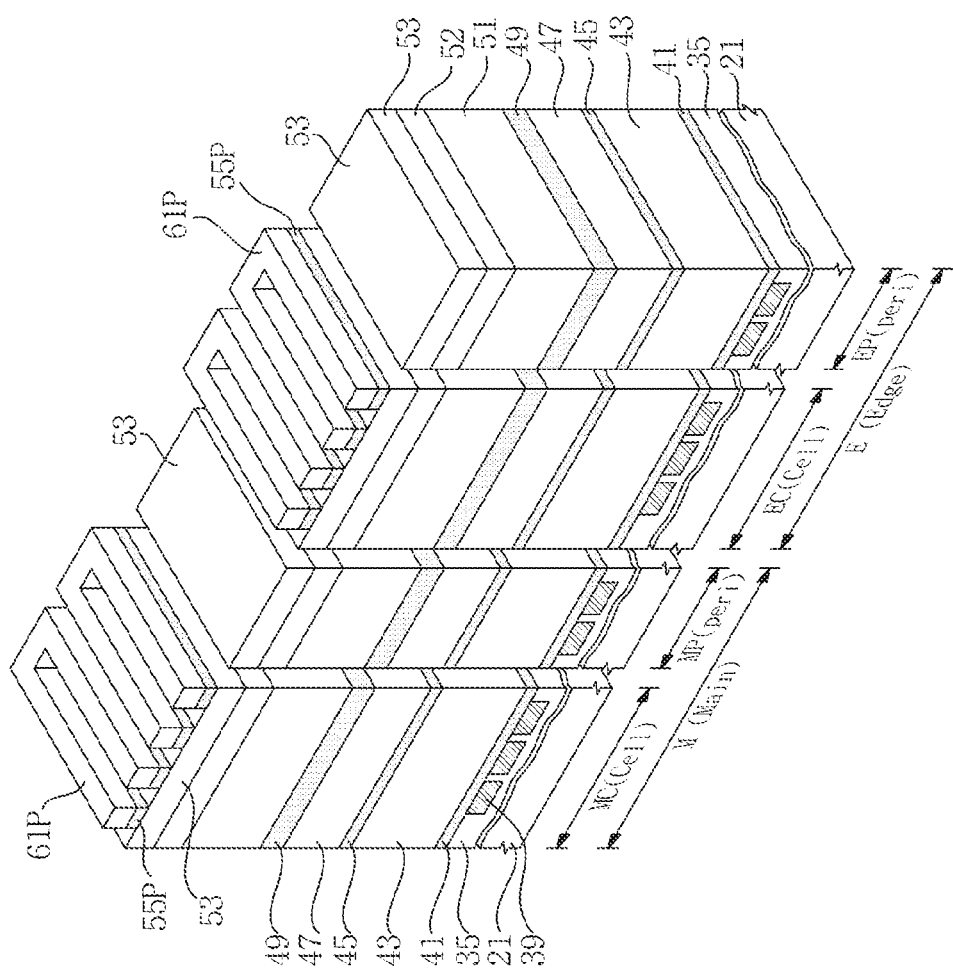

Referring to FIG. 7, first preliminary mask patterns 61P may be formed by partially removing the first preliminary mask layer 61 using an anisotropic etching process (B22). First ARC patterns 55P may be formed under the first preliminary mask patterns 61P. The second ARC patterns 57P and the first sacrificial patterns 56P may be removed. The second auxiliary mask layer 53 may be exposed on the first peripheral region MP and the second peripheral region EP. The first preliminary mask patterns 61P may include parallel line shapes or parallel bar shapes. On the first cell region MC and the second cell region EC, the second auxiliary mask layer 53 may be exposed between the first preliminary mask patterns 61P.

Figure 8:
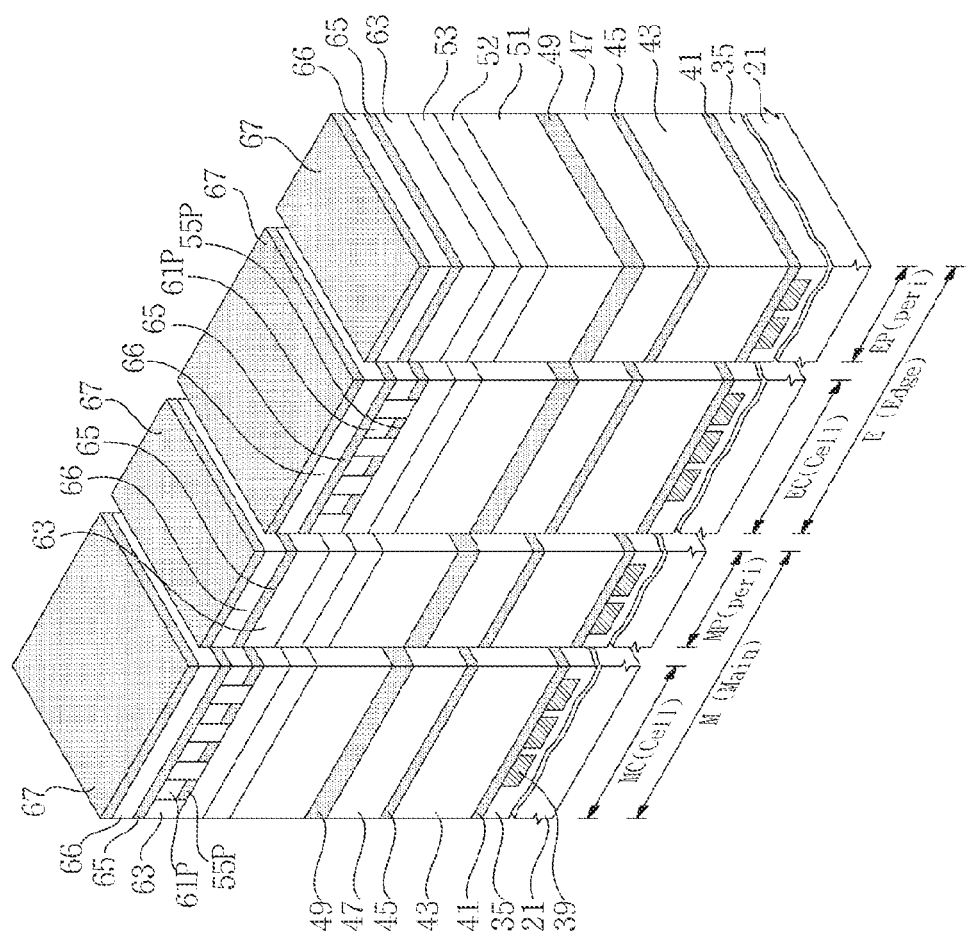

Referring to FIG. 8, a first gap fill layer 63, a third ARC layer 65, a second sacrificial layer 66, and a fourth ARC layer 67 may be formed. The first gap fill layer 63 may cover the second auxiliary mask layer 53. The first gap fill layer 63 may fill between the first ARC patterns 55P and between the first preliminary mask patterns 61P. The third ARC layer 65 may be formed on the first gap fill layer 63. The second sacrificial layer 66 may be formed on the third ARC layer 65. The fourth ARC layer 67 may be formed on the second sacrificial layer 66. The third ARC layer 65, the second sacrificial layer 66, and the fourth ARC layer 67 may cover the first cell region MC, the first peripheral region MP, the second cell region EC, and the second peripheral region EP.

Figure 9:
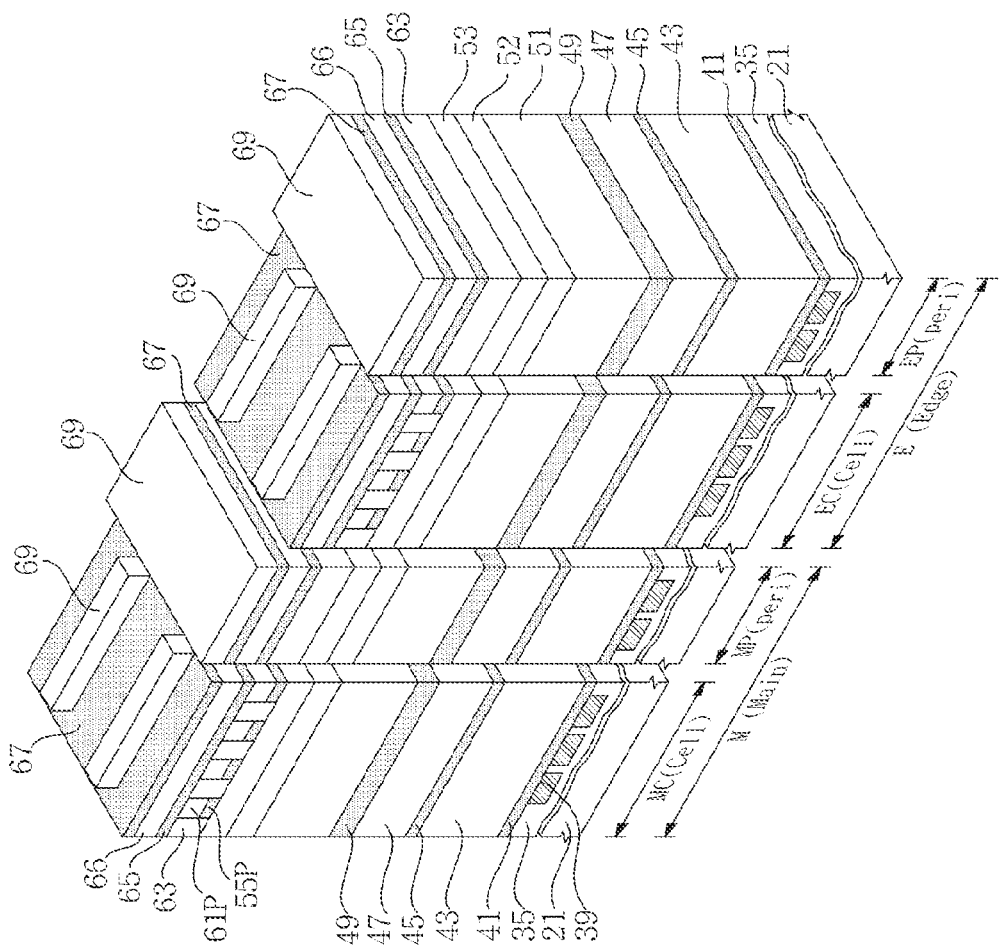

Referring to FIG. 9, second photo mask patterns 69 may be formed on the fourth ARC layer 67.

The second photo mask patterns 69 may be formed using a photolithography process. The second photo mask patterns 69 may completely cover the first peripheral region MP and the second peripheral region EP, and partially cover the first cell region MC and the second cell region EC. The second photo mask patterns 69 formed on the first cell region MC and the second cell region EC may have parallel line shapes or parallel bar shapes. On the first cell region MC and the second cell region EC, the second photo mask patterns 69 may be perpendicular to the first preliminary mask patterns 61P. On the first cell region MC and the second cell region EC, the fourth ARC layer 67 may be exposed between the second photo mask patterns 69.

In example embodiments, on the first cell region MC and the second cell region EC, the second photo mask patterns 69 may obliquely cross the first preliminary mask patterns 61P.

Figure 10:
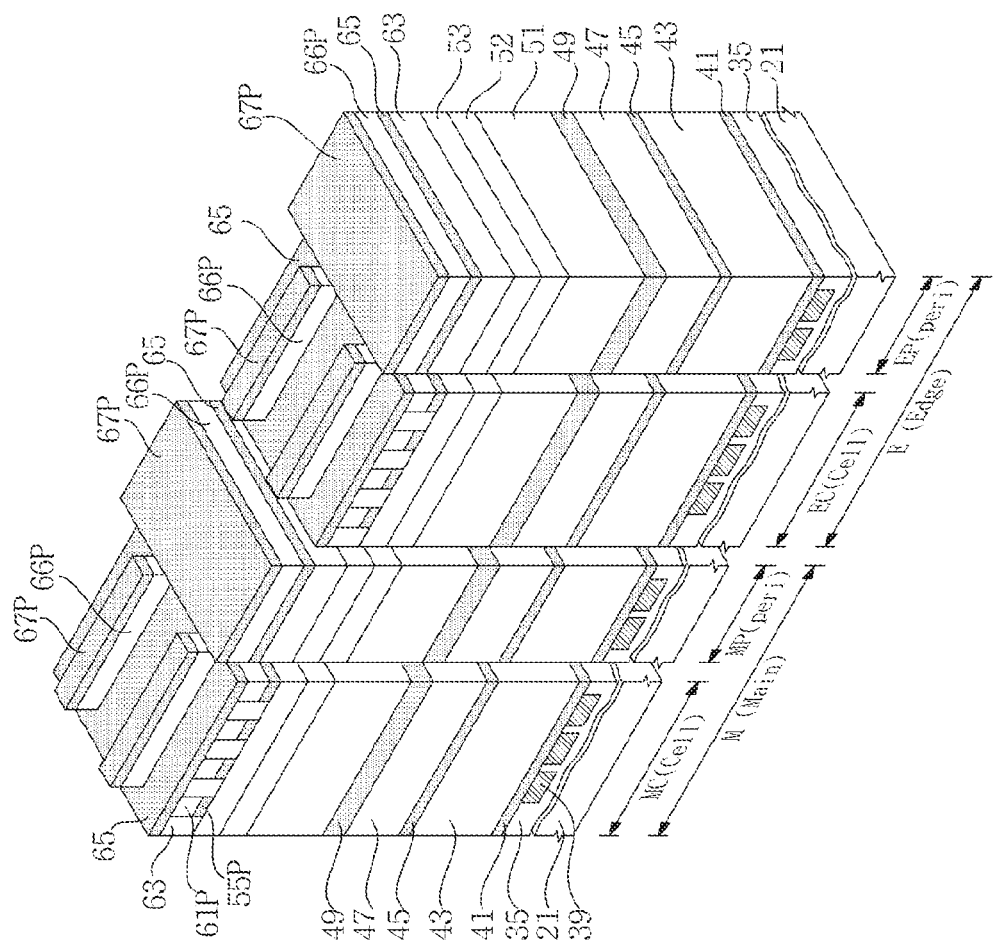

Referring to FIG. 10, fourth ARC patterns 67P and second sacrificial patterns 66P may be formed by etching the fourth ARC layer 67 and the second sacrificial layer 66 using the second photo mask patterns 69 as etching masks. The fourth ARC patterns 67P may remain on the second sacrificial patterns 66P. The fourth ARC patterns 67P may be exposed by removing the second photo mask patterns 69. The fourth ARC patterns 67P and the second sacrificial patterns 66P may completely cover the first peripheral region MP and the second peripheral region EP, and partially cover the first cell region MC and the second cell region EC. The fourth ARC patterns 67P formed on the first cell region MC and the second cell region EC may have parallel line shapes or parallel bar shapes. On the first cell region MC and the second cell region EC, the third ARC layer 65 may be exposed between the second sacrificial patterns 66P.

Figure 11:
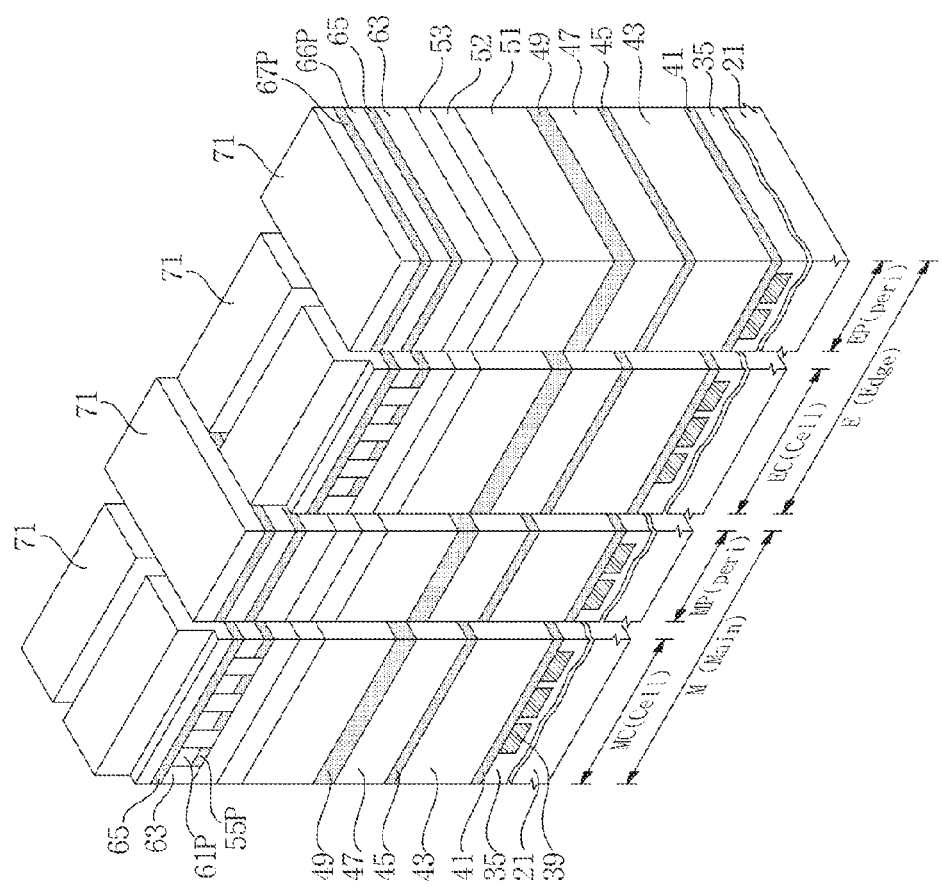

Referring to FIG. 11, a second preliminary mask layer 71 may be formed on the second sacrificial patterns 66P (B24).

The second preliminary mask layer 71 may entirely cover the first cell region MC, the first peripheral region MP, the second cell region EC, and the second peripheral region EP. The second preliminary mask layer 71 may include a material having an etch selectivity with respect to the fourth ARC patterns 67P and the second sacrificial patterns 66P.

The second preliminary mask layer 71 may include an ALD oxide layer. The second preliminary mask layer 71 may cover upper portions and side surfaces of the fourth ARC patterns 67P and the second sacrificial patterns 66P to have a uniform thickness.

Figure 12:
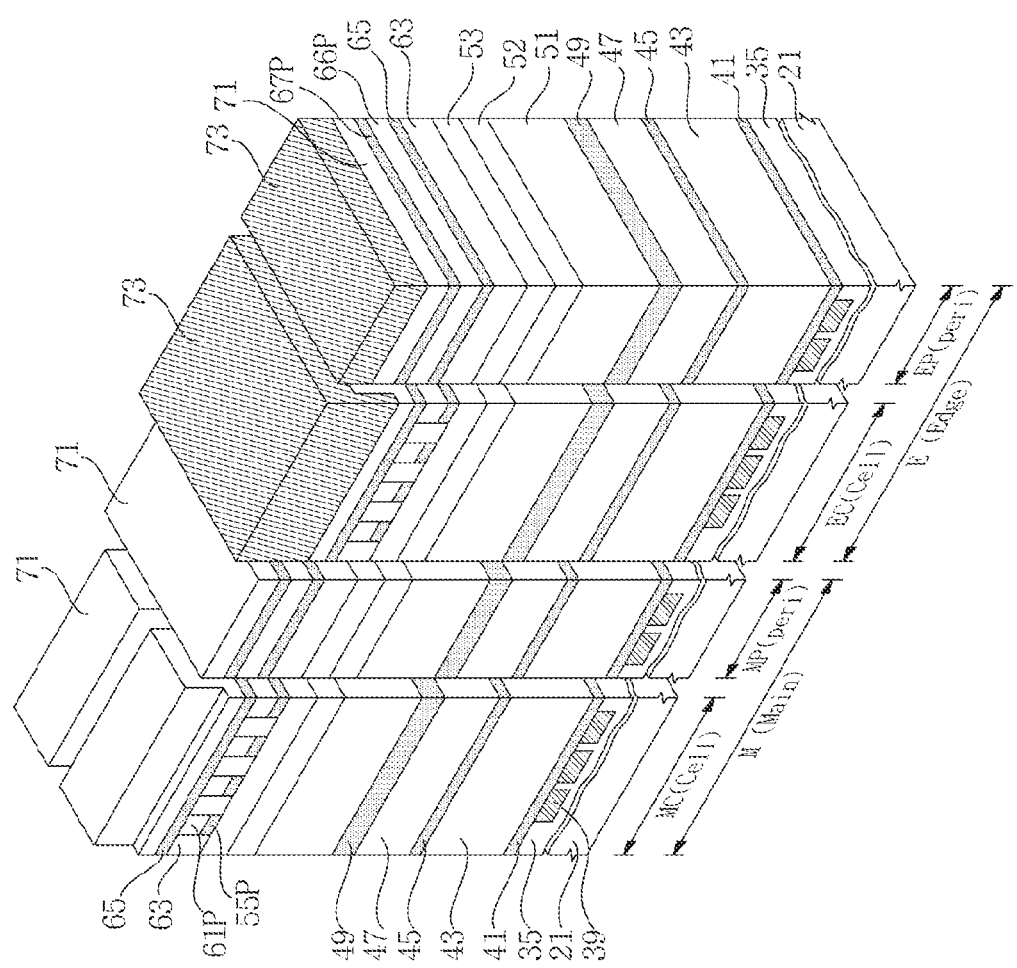

Referring to FIG. 12, a first edge blocking layer 73 may be formed on the second preliminary mask layer 71 (B30). A process using the first edge blocking layer 73 may be interpreted as a first PSES process.

The first edge blocking layer 73 may include a negative photoresist. The negative photoresist may have a characteristic in which an exposed region remains. The first edge blocking layer 73 may be formed using a photolithography process. A reticle having a light projection pattern that entirely exposes an upper portion of the edge chip E may be used to form the first edge blocking layer 73. The first edge blocking layer 73 may completely cover the second cell region EC and the second peripheral region EP, and the second preliminary mask layer 71 may be exposed on the first cell region MC and the first peripheral region MP. The first edge blocking layer 73 may be directly in contact with the second preliminary mask layer 71 formed on the second cell region EC and the second peripheral region EP.

Figure 13:
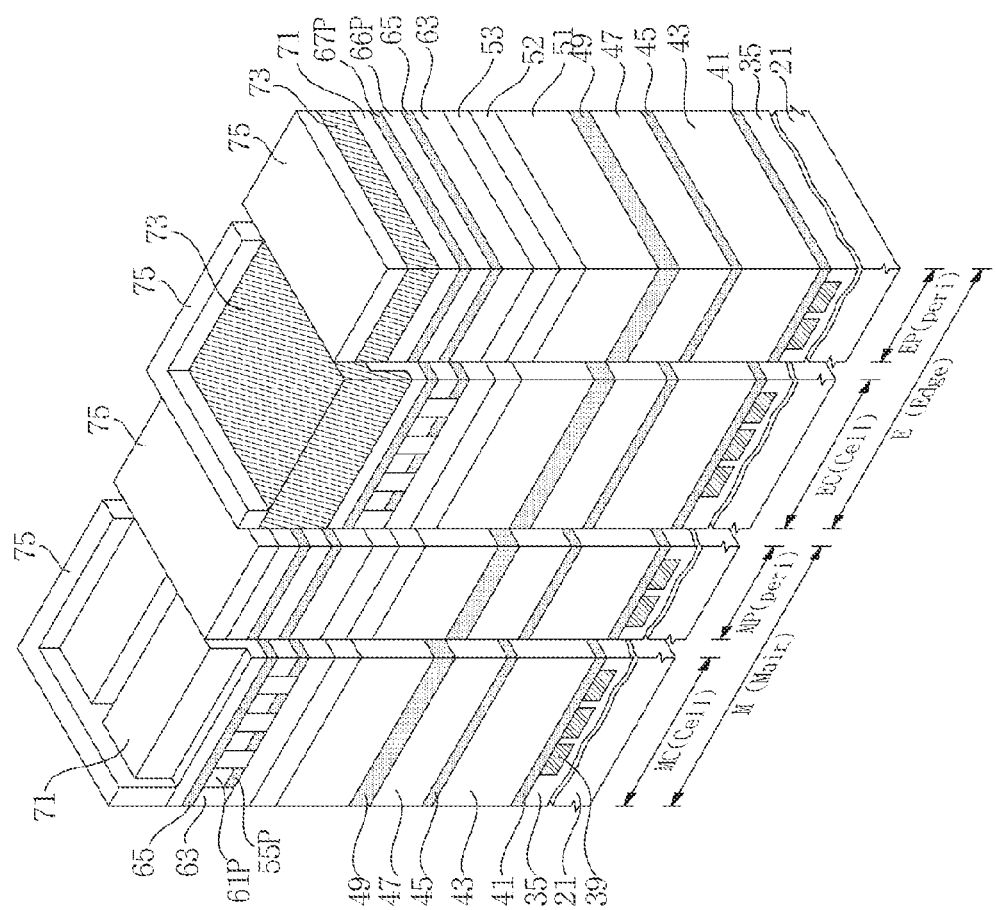

Referring to FIG. 13, trim patterns 75 may be formed (B32).

The trim patterns 75 may include a positive photoresist. The positive photoresist may have a characteristic in which an exposed region is removed. The trim patterns 75 may be formed using a photolithography process. The trim patterns 75 may partially cover the second preliminary mask layer 71 of the first cell region MC, completely cover the second preliminary mask layer 71 of the first peripheral region MP, partially cover the second preliminary mask layer 71 of the second cell region EC, and completely cover the second preliminary mask layer 71 of the second peripheral region EP. The trim patterns 75 may cover upper portions of edges of the first preliminary mask patterns 61P of the first cell region MC, and may cover upper portions of edges of the second preliminary mask layer 71 of the first cell region MC.

Figure 14:
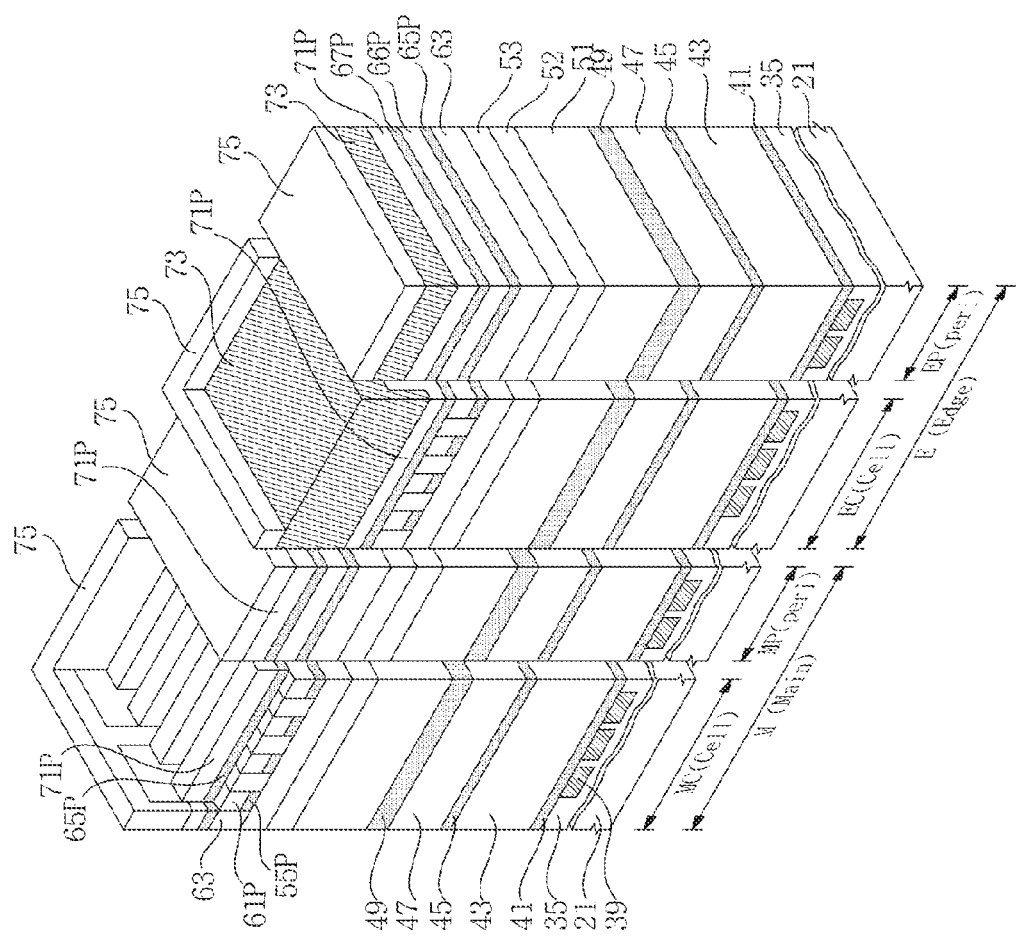

Referring to FIG. 14, second preliminary mask patterns 71P may be formed by etching the second preliminary mask layer 71 using an anisotropic etching process (B34). Third ARC patterns 65P may be formed under the second preliminary mask patterns 71P.

On the upper portion of the first cell region MC, the second preliminary mask patterns 71P may have parallel line shapes or parallel bar shapes. The second preliminary mask patterns 71P may be self-aligned at both sides of the second sacrificial patterns 66P. The second sacrificial patterns 66P and the fourth ARC patterns 67P may be removed. The second preliminary mask patterns 71P may be perpendicular to the first preliminary mask patterns 61P. The first preliminary mask patterns 61P and the first gap fill layer 63 may be exposed between the second preliminary mask patterns 71P.

In example embodiments, the second preliminary mask patterns 71P may obliquely cross the first preliminary mask patterns 61P.

On the upper portion of the first peripheral region MP, the second preliminary mask patterns 71P may remain under the trim patterns 75. The second preliminary mask patterns 71P may completely cover the upper portion of the first peripheral region MP. The fourth ARC patterns 67P may remain under the second preliminary mask patterns 71P.

On the upper portion of the second cell region EC, the second preliminary mask patterns 71P may remain under the first edge blocking layer 73. The first edge blocking layer 73 may serve to prevent etching damage of the second preliminary mask patterns 71P from being generated. The second preliminary mask patterns 71P may completely cover the upper portion of the second cell region EC. The fourth ARC patterns 67P, the second sacrificial patterns 66P, and the third ARC patterns 65P may remain under the second preliminary mask patterns 71P.

On the upper portion of the second peripheral region EP, the first edge blocking layer 73 may remain under the trim patterns 75. The second preliminary mask patterns 71P may remain under the first edge blocking layer 73. The second preliminary mask patterns 71P may completely cover the upper portion of the second peripheral region EP. The fourth ARC patterns 67P, the second sacrificial patterns 66P, and the third ARC patterns 65P may remain under the second preliminary mask patterns 71P.

Figure 15:
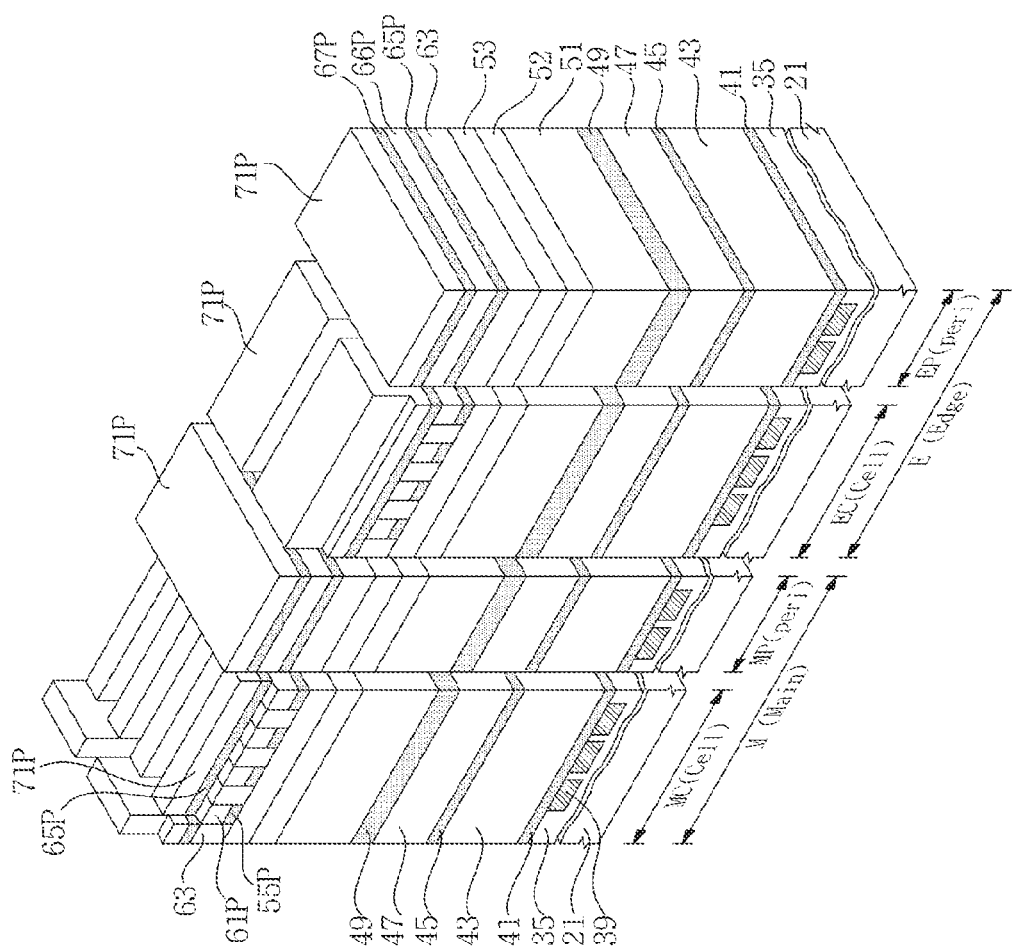

Referring to FIG. 15, the second preliminary mask patterns 71P may be exposed by removing the trim patterns 75 and the first edge blocking layer 73. The second preliminary mask patterns 71P may entirely cover the upper portions of the first peripheral region MP, the second cell region EC, and the second peripheral region EP, and partially cover the upper portion of the first cell region MC.

Figure 16:
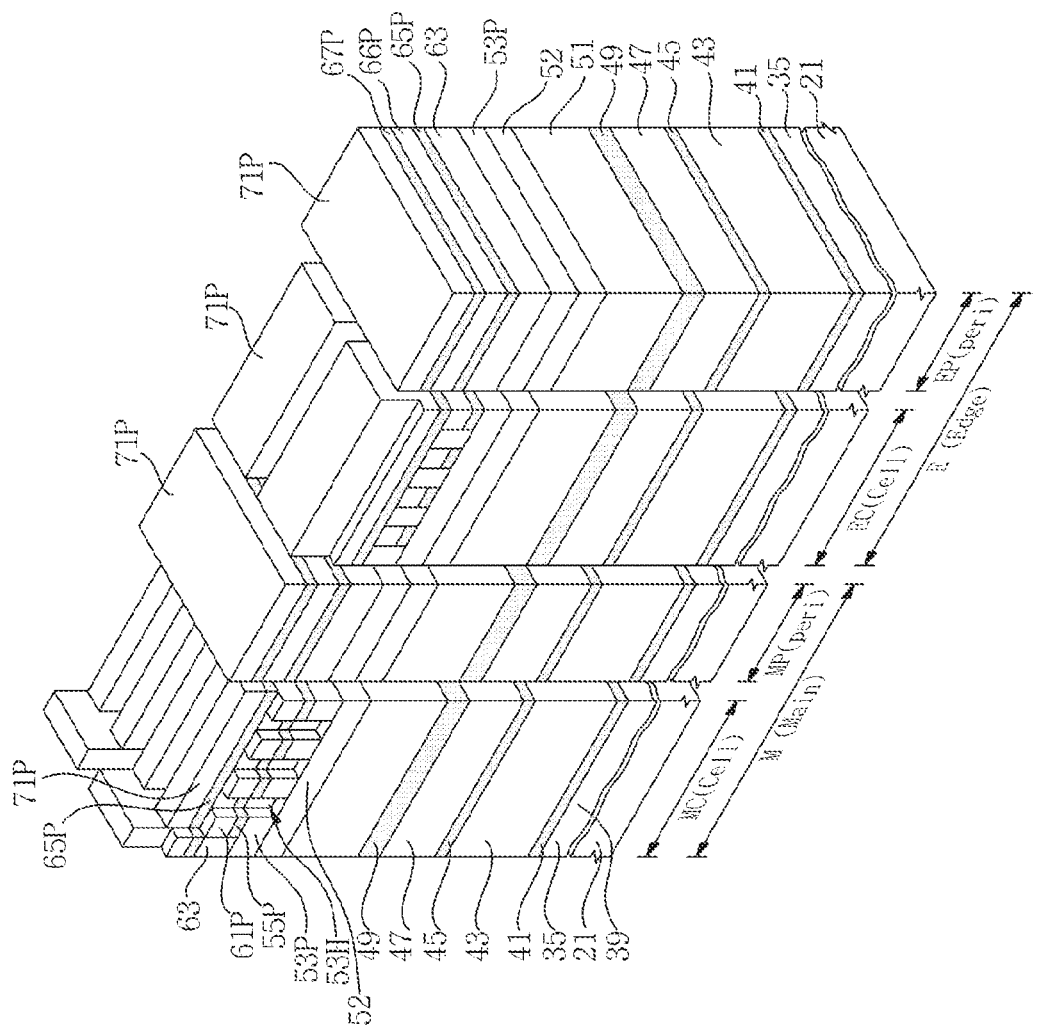

Referring to FIG. 16, second auxiliary mask patterns 53P and second auxiliary mask holes 53H may be formed by anisotropic etching the first gap fill layer 63 and the second auxiliary mask layer 53 using the second preliminary mask patterns 71P, the third ARC patterns 65P, the first preliminary mask patterns 61P, and the first ARC patterns 55P as etching masks. The second auxiliary mask holes 53H may pass through the second auxiliary mask patterns 53P and expose the first auxiliary mask layer 52.

Figure 17:
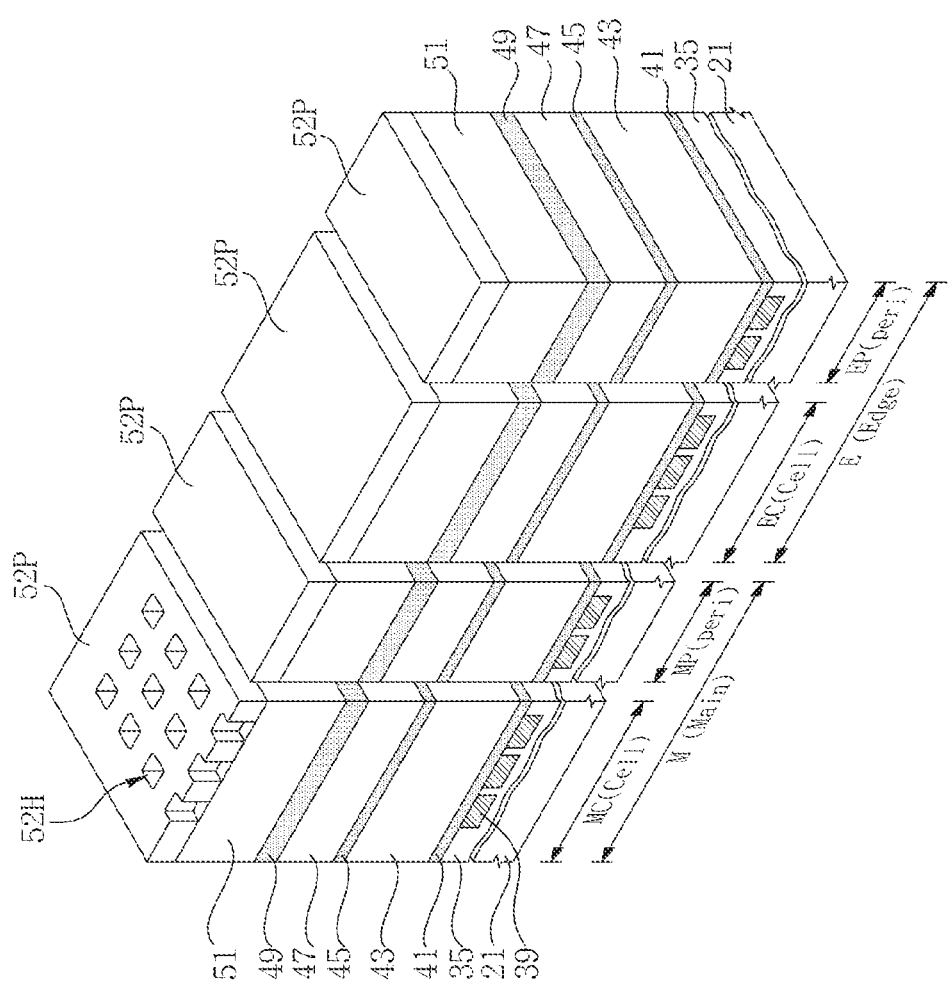

Referring to FIG. 17, the second auxiliary mask patterns 53P may be exposed by removing the second preliminary mask patterns 71P, the fourth ARC patterns 67P, the second sacrificial patterns 66P, the third ARC patterns 65P, the first gap fill layer 63, the first preliminary mask patterns 61P, and the first ARC patterns 55P. First auxiliary mask patterns 52P and first auxiliary mask holes 52H may be formed by anisotropic etching the first auxiliary mask layer 52 using the second auxiliary mask patterns 53P as etching masks. The first auxiliary mask patterns 52P may be exposed by removing the second auxiliary mask patterns 53P. The first auxiliary mask holes 52H may pass through the first auxiliary mask patterns 52P and expose the mask layer 51. The first auxiliary mask patterns 52P may entirely cover the upper portions of the first peripheral region MP, the second cell region EC, and the second peripheral region EP.

Figure 18:
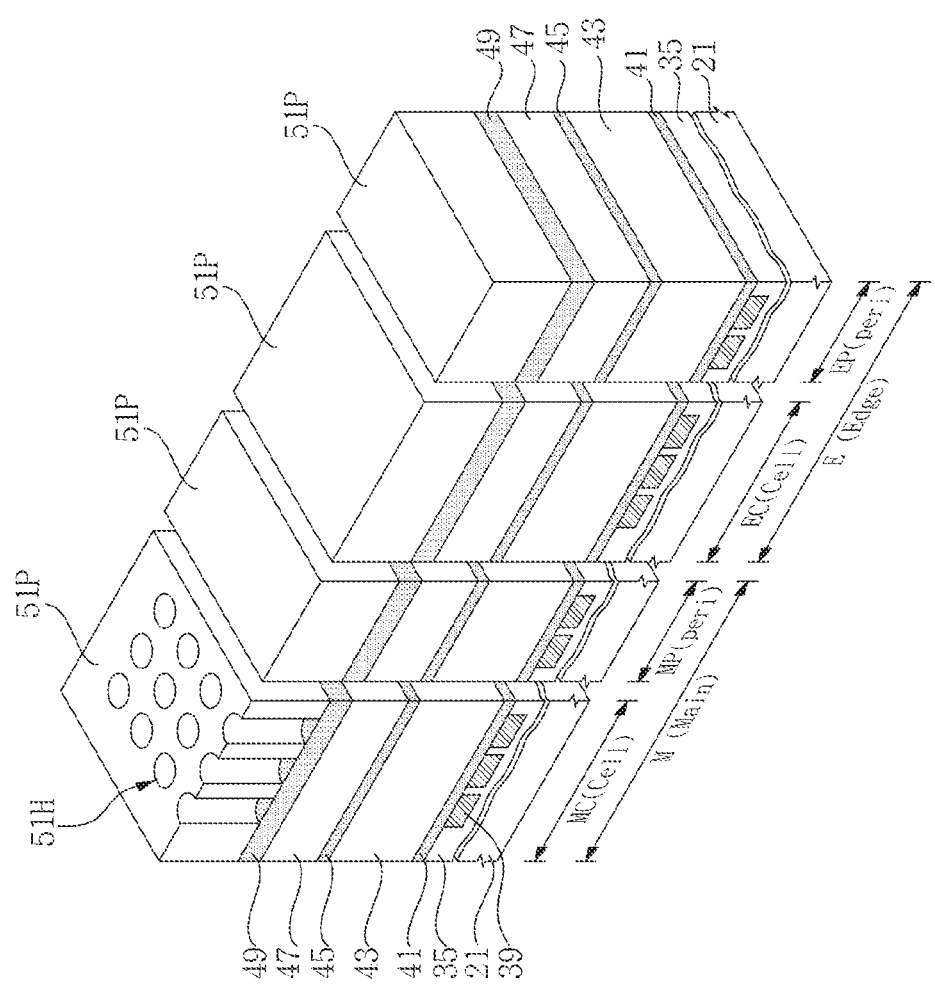

Referring to FIG. 18, mask patterns 51P and mask holes 51H may be formed by anisotropic etching the mask layer 51 using the first auxiliary mask patterns 52P as etching masks (B40). The mask holes 51H may pass through the mask patterns 51P and expose the top supporter layer 49. The mask patterns 51P may entirely cover the upper portions of the first peripheral region MP, the second cell region EC, and the second peripheral region EP.

Figure 19:
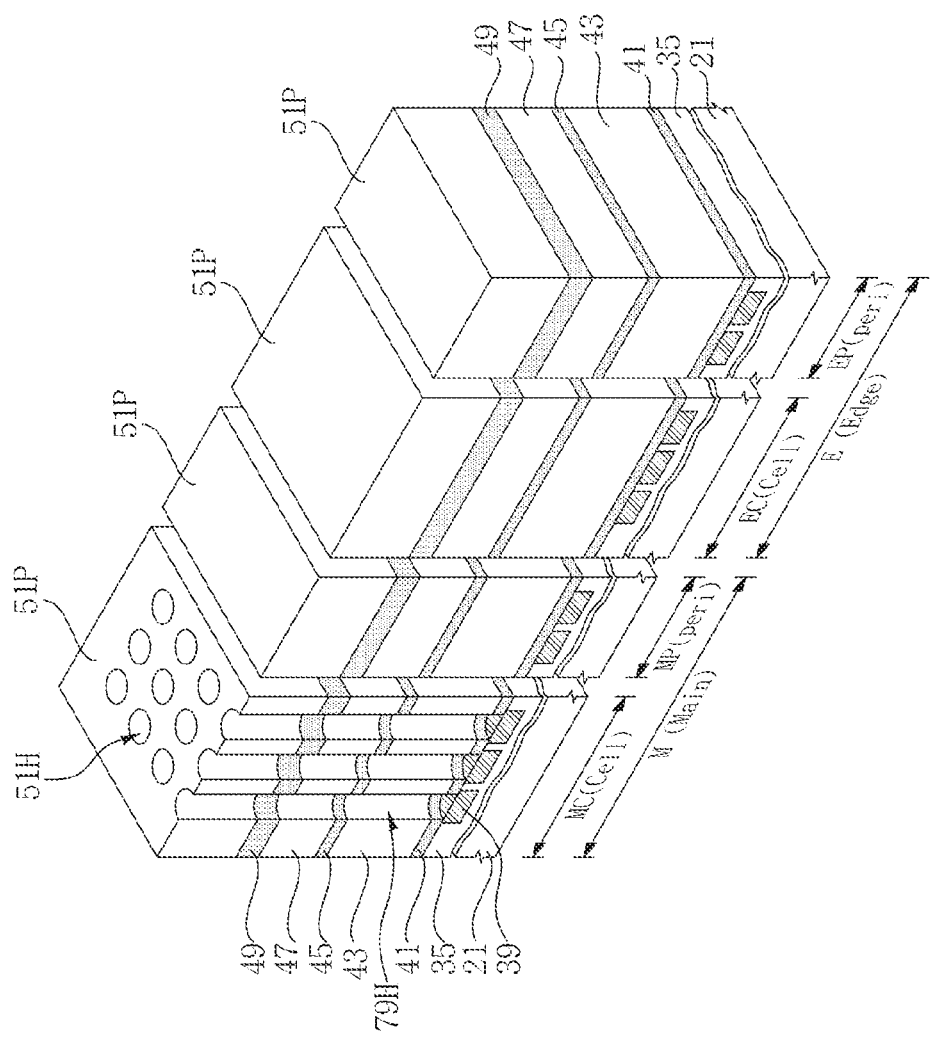

Referring to FIG. 19, the storage holes 79H may be formed by anisotropic etching the top supporter layer 49, the second molding layer 47, the middle supporter layer 45, the first molding layer 43, and the etch stop layer 41 using the mask patterns 51P as etching masks (B42). The storage holes 79H may pass through the top supporter layer 49, the second molding layer 47, the middle supporter layer 45, the first molding layer 43, and the etch stop layer 41 and expose the landing pads 39. An anisotropic etching process may be applied to the formation of the storage holes 79H. Each of the storage holes 79H may have a vertical height greater than a horizontal width.

Figure 20:
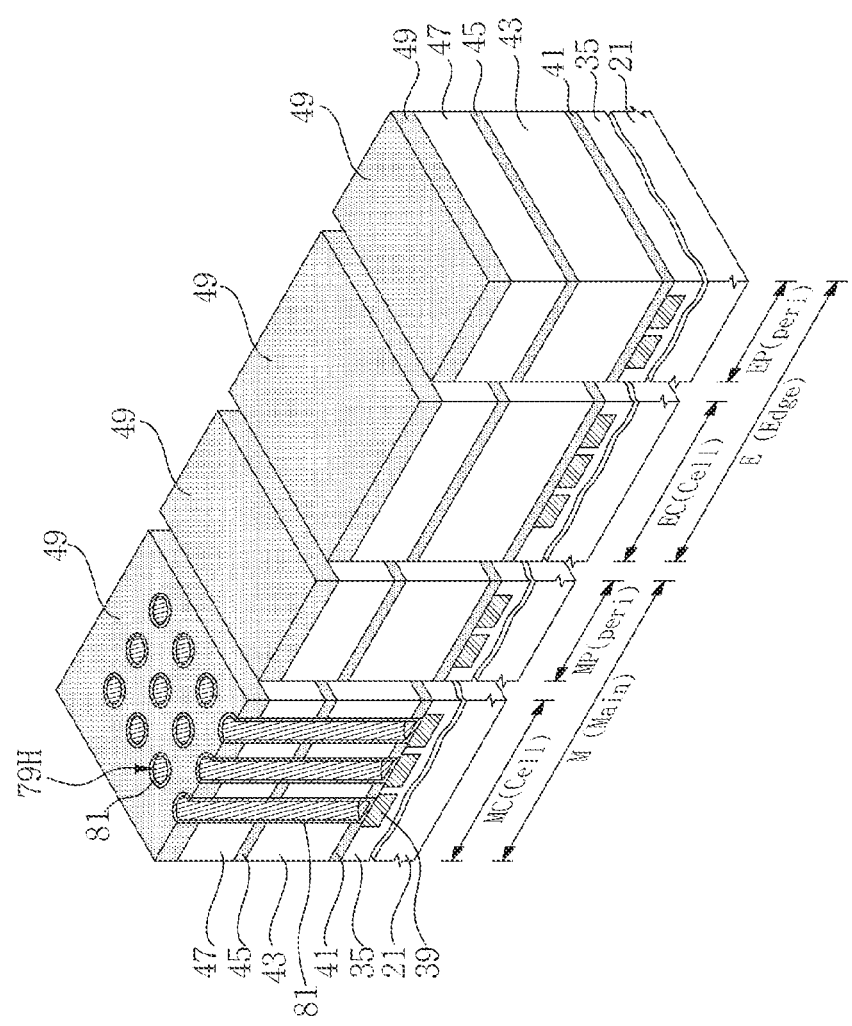

Referring to FIG. 20, the top supporter layer 49 may be exposed by removing the mask patterns 51P. Lower electrodes 81 may be formed in the storage holes 79H (B44). The lower electrodes 81 may be interpreted as storage electrodes or storage nodes. The process of forming the lower electrodes 81 may include a thin film forming process and an etch-back process. An upper surface of the top supporter layer 49 may be exposed. The lower electrode 81 may include a conductive material such as a metal, a metal nitride, a metal oxide, a metal silicide, conductive carbon, or a combination thereof. For example, the lower electrode 81 may include Ti, TiN, TiAlN, TiCN, Ta, TaN, TaAlN, TaCN, Ru, Pt, or a combination thereof. The lower electrodes 81 may be directly in contact with the landing pads 39. The lower electrodes 81 may conformally cover inner walls of the storage holes 79H. The lower electrode 81 may be interpreted as a cylindrical shape or a crown shape.

In example embodiments, the lower electrode 81 may include a pillar shape, a box shape, a cylindrical shape, a crown shape, or a combination thereof.

According to example embodiments of inventive concepts, the formation of the first photo mask patterns 59 may be interpreted as a first photolithography process, the formation of the second photo mask patterns 69 may be interpreted as a second photolithography process, and the formation of the trim patterns 75 may be interpreted as a third photolithography process. A process using the first edge blocking layer 73 may be interpreted as a first PSES process. Patterns such as the storage holes 79H and the lower electrodes 81 are limited (and/or prevented) from being formed on the edge chip E by performing a PSES process once while a photolithography process is performed three times, and thus it is possible to simplify a semiconductor forming process.

Figure 21:
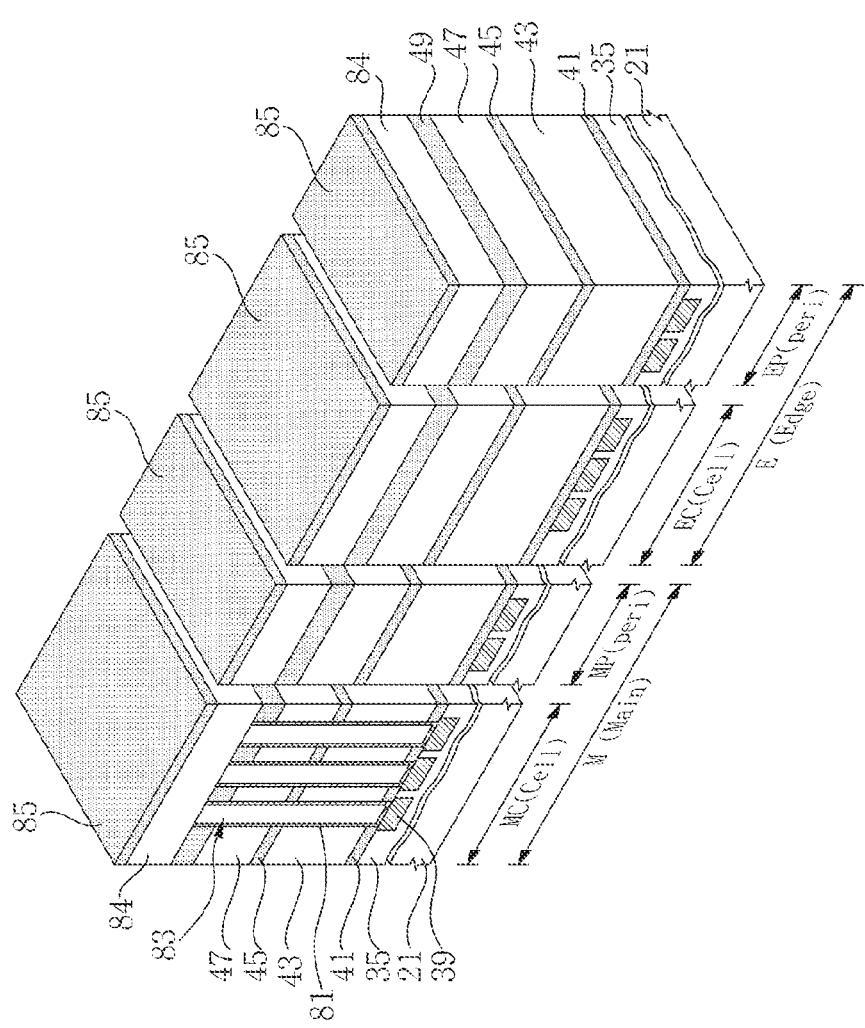

Referring to FIG. 21, a second gap fill layer 83 may be formed in the storage holes 79H. A supporter mask layer 84 may be formed on the top supporter layer 49 (B46). A fifth ARC layer 85 may be formed on the supporter mask layer 84. The second gap fill layer 83 may be omitted. The second gap fill layer 83 may include an SOH layer. The supporter mask layer 84 may include an amorphous carbon layer (ACL). The fifth ARC layer 85 may include silicon nitride or silicon oxynitride.

Figure 22:
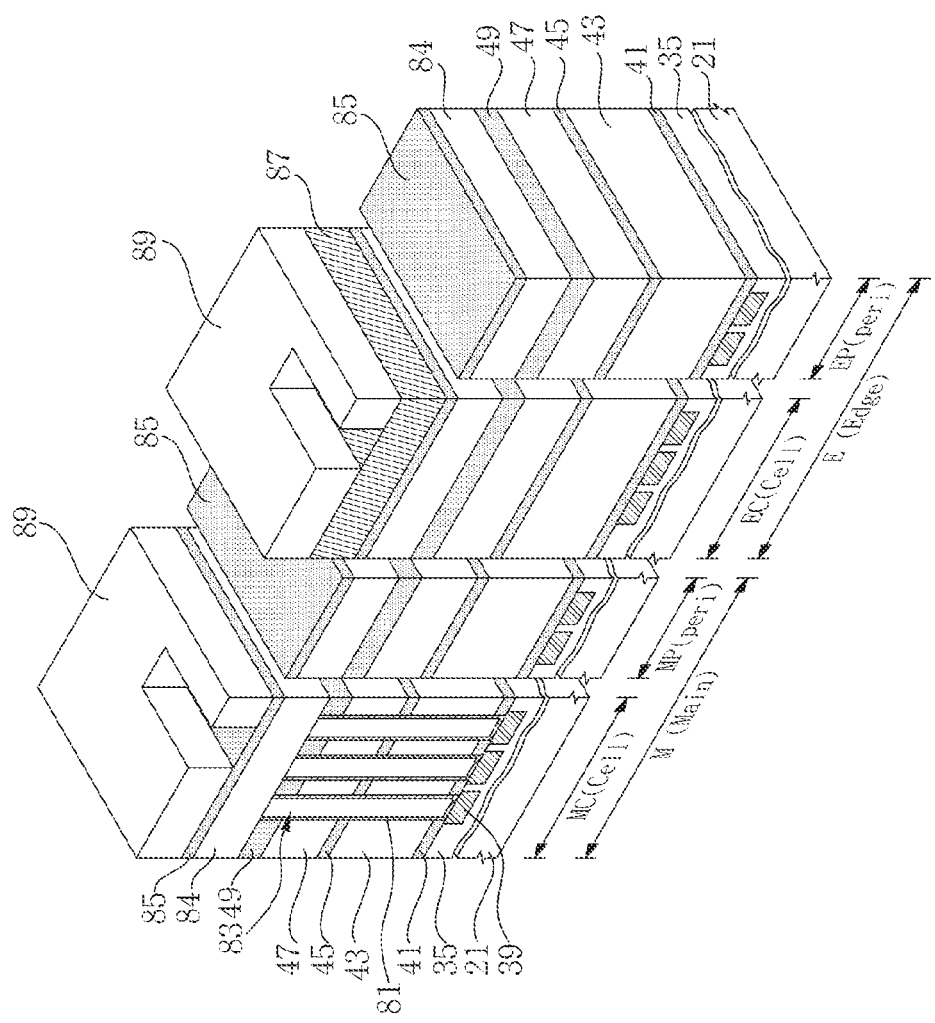

Referring to FIG. 22, a second edge blocking layer 87 may be formed on the fifth ARC layer 85 (B50). A process using the second edge blocking layer 87 may be interpreted as a second PSES process. Third photo mask patterns 89 may be formed.

The second edge blocking layer 87 may include a negative photoresist. The negative photoresist may have a characteristic in which an exposed region remains. The second edge blocking layer 87 may be formed using a photolithography process. A reticle including a light projection pattern and a light shielding pattern may be used to form the second edge blocking layer 87. For example, a plurality of first cell regions MC may be formed on the main chip M, and the first peripheral region MP may be formed between the first cell regions MC and on the periphery of the first cell region MC. On the edge chip E, a plurality of second cell regions EC may be formed corresponding to the main chip M, and the second peripheral region EP may be formed between the second cell regions EC and on the periphery of the second cell region EC. The reticle used to from the second edge blocking layer 87 may include light projection patterns which expose the upper portions of the second cell regions EC and light shielding patterns which shield the upper portion of the second peripheral region EP. The light projection patterns and the light shielding patterns may be alternately and repeatedly formed to have substantially the same density as the first peripheral region MP. The second edge blocking layer 87 may completely cover the second cell regions EC, and expose the fifth ARC layer 85 on the first cell region MC, the first peripheral region MP, and the second peripheral region EP.

The third photo mask patterns 89 may include a positive photoresist. The positive photoresist may have a characteristic in which the exposed region is removed. The third photo mask patterns 89 may be formed using a photolithography process. The third photo mask patterns 89 may partially cover the fifth ARC layer 85 of the first cell region MC, expose the fifth ARC layer 85 of the first peripheral region MP, partially cover the second edge blocking layer 87 of the second cell region EC, and expose the fifth ARC layer 85 of the second peripheral region EP.

Figure 23:
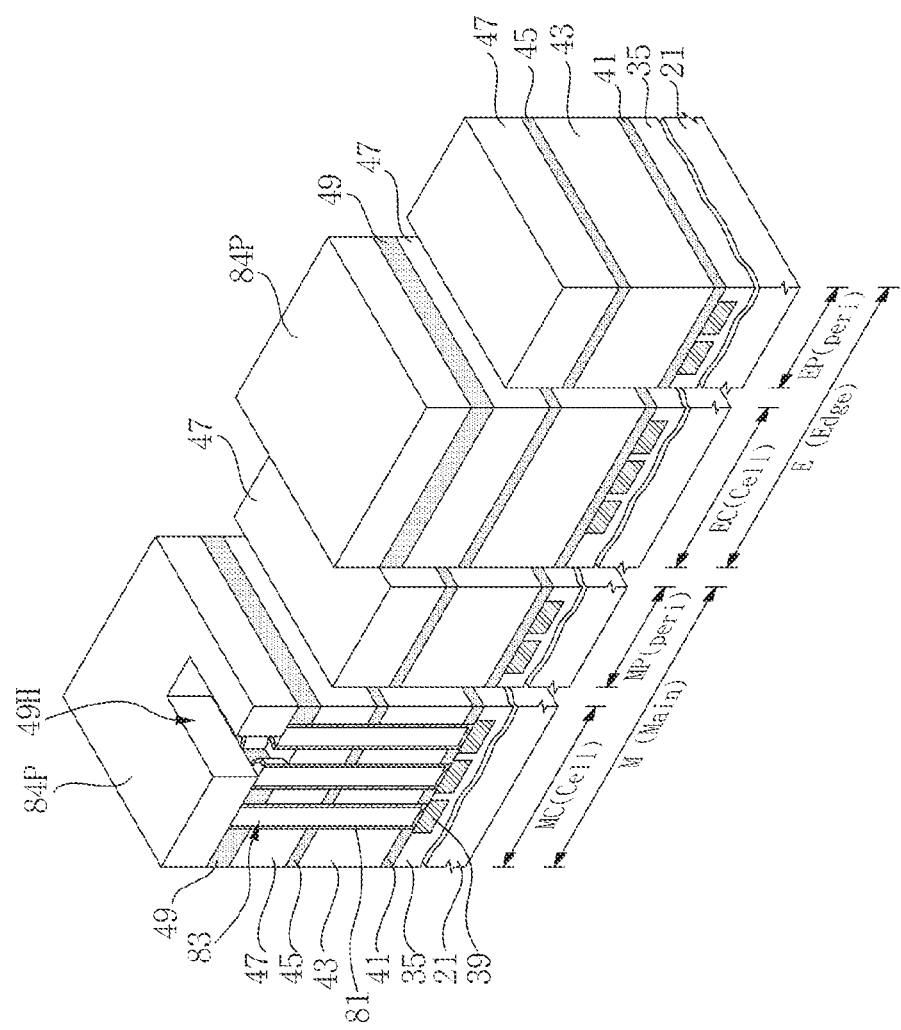
Figure 24:
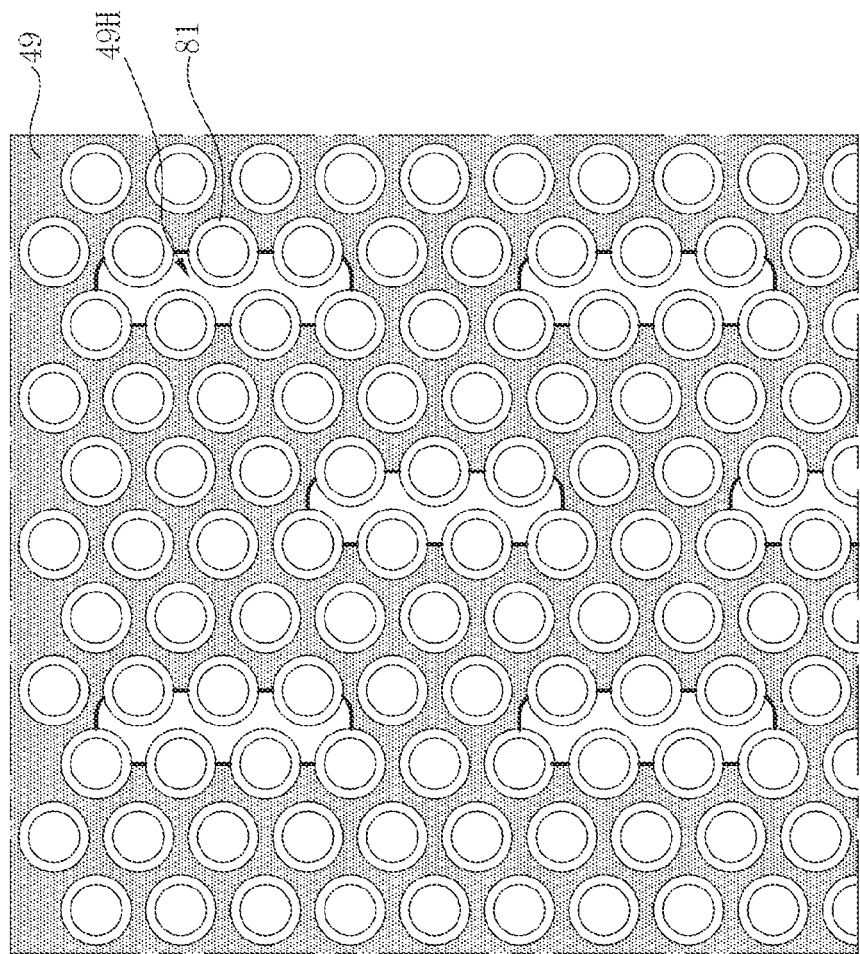

Referring to FIG. 23, supporter mask patterns 84P may be formed by anisotropic etching the fifth ARC layer 85 and the supporter mask layer 84 using the third photo mask patterns 89 as etching masks (B52). A top supporter opening 49H passing through the top supporter layer 49 may be formed using the supporter mask patterns 84P as etching masks (B54). The third photo mask patterns 89, the second edge blocking layer 87, and the fifth ARC layer 85 may be removed.

On the upper portion of the first cell region MC, the supporter mask patterns 84P may remain on the top supporter layer 49. The second molding layer 47 may be exposed on a bottom of the top supporter opening 49H.

On the upper portion of the first peripheral region MP, the top supporter layer 49 may be removed, and the second molding layer 47 may be exposed.

On the upper portion of the second cell region EC, the top supporter layer 49 may remain under the supporter mask patterns 84P. The second edge blocking layer 87 may serve to prevent the supporter mask patterns 84P from being damaged. The top supporter layer 49 may entirely cover the upper portion of the second cell region EC.

On the upper portion of the second peripheral region EP, the top supporter layer 49 may be removed, and the second molding layer 47 may be exposed.

Referring to FIG. 24, the lower electrodes 81 passing through the top supporter layer 49 and the top supporter openings 49H may be repeatedly formed in a plan view. The lower electrodes 81 and the top supporter openings 49H may have various shapes and a regular arrangement.

Figure 25:
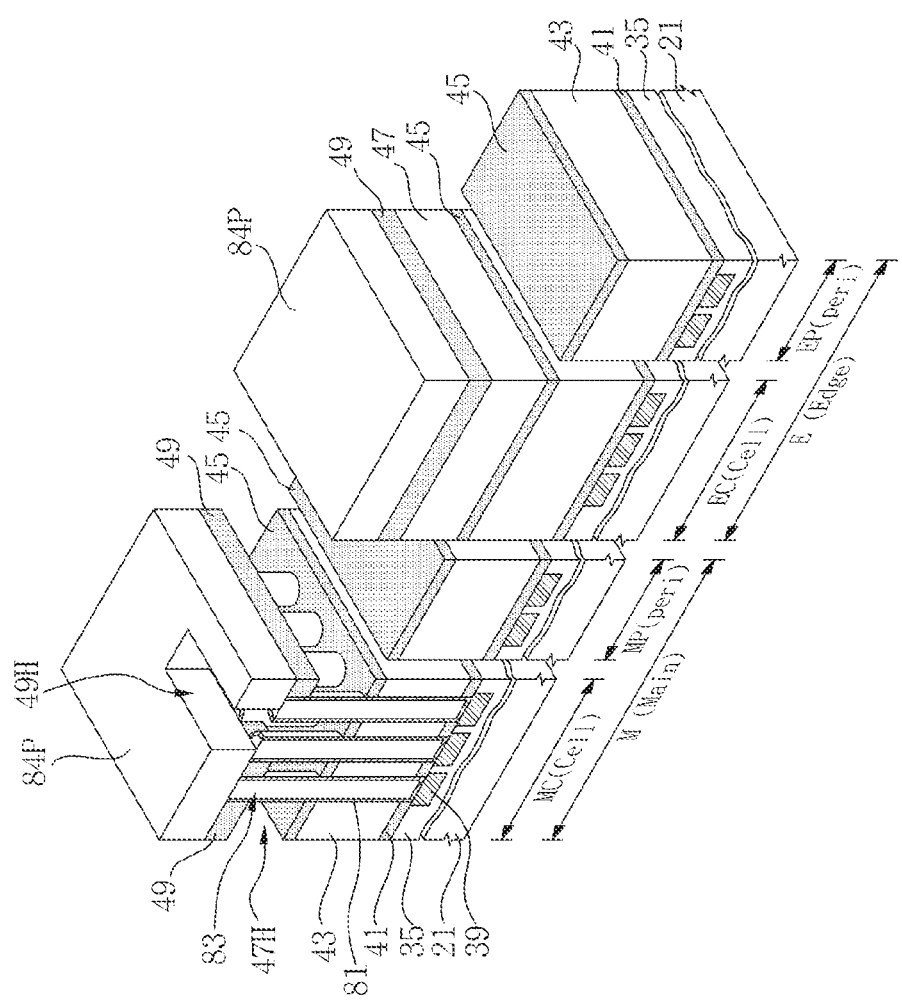

Referring to FIG. 25, the molding layers 43 and 47 may be removed (B56). For example, upper spaces 47H may be formed by removing the second molding layer 47.

On the upper portion of the first cell region MC, the second molding layer 47 may be removed, and the middle supporter layer 45 may be exposed. Side surfaces of the lower electrode 81, a lower surface of the top supporter layer 49, and an upper surface of the middle supporter layer 45 in the upper spaces 47H may be exposed.

On the upper portion of the first peripheral region MP, the second molding layer 47 may be removed, and the middle supporter layer 45 may be exposed.

On the upper portion of the second cell region EC, the second molding layer 47 may remain under the top supporter layer 49.

On the upper portion of the second peripheral region EP, the second molding layer 47 may be removed, and the middle supporter layer 45 may be exposed.

Figure 26:
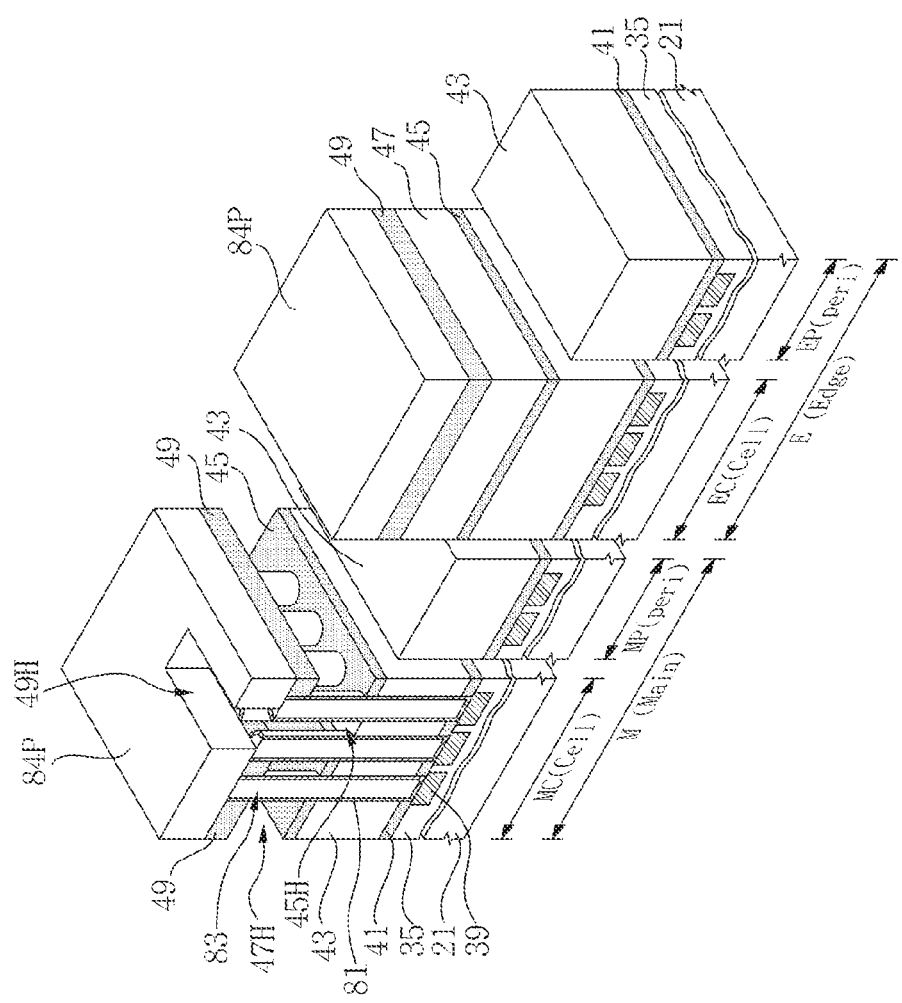

Referring to FIG. 26, middle supporter openings 45H may be formed by anisotropic etching the middle supporter layer 45 using the supporter mask patterns 84P as etching masks.

On the upper portion of the first cell region MC, the first molding layer 43 may be exposed under the middle supporter openings 45H. The middle supporter openings 45H may be aligned under the top supporter opening 49H.

On the upper portion of the first peripheral region MP, the middle supporter layer 45 may be removed, and the first molding layer 43 may be exposed.

On the upper portion of the second cell region EC, the middle supporter layer 45 may remain under the second molding layer 47.

On the upper portion of the second peripheral region EP, the middle supporter layer 45 may be removed, and the first molding layer 43 may be exposed.

Figure 27:
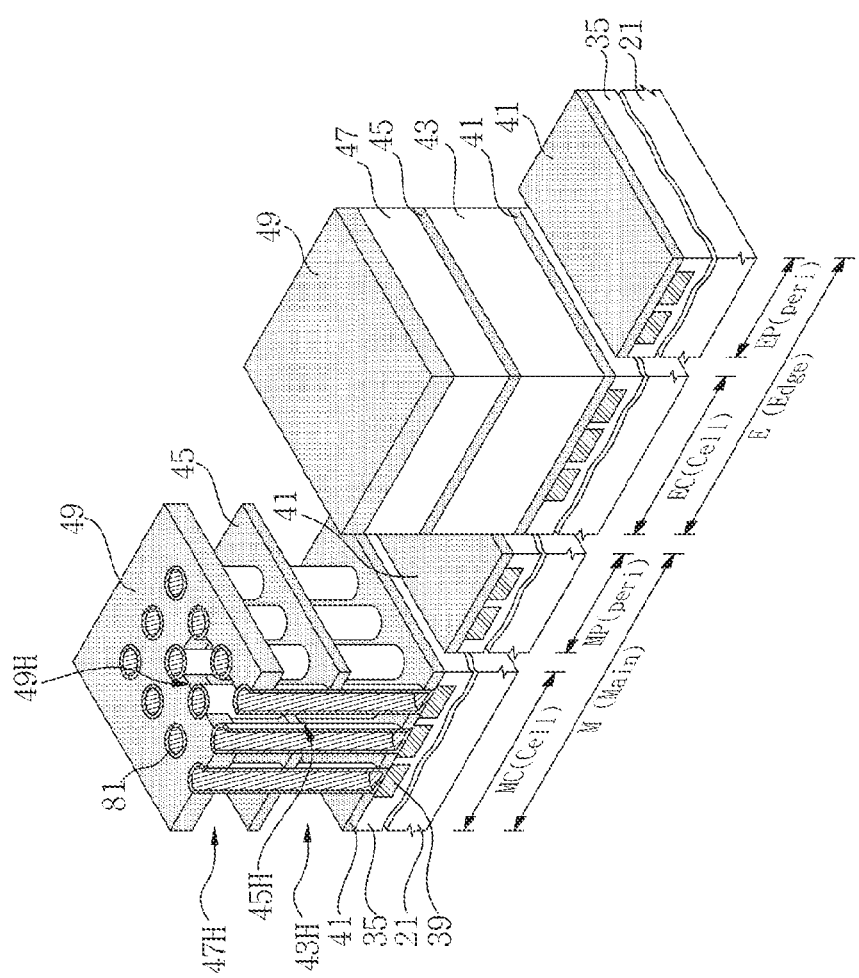

Referring to FIG. 27, lower spaces 43H may be formed by removing the first molding layer 43. The upper surface of the top supporter layer 49 may be exposed by removing the supporter mask patterns 84P. The lower electrodes 81 may be exposed by removing the second gap fill layer 83.

On the upper portion of the first cell region MC, the first molding layer 43 may be removed, and the etch stop layer 41 may be exposed. The side surfaces of the lower electrode 81, the lower surface of the middle supporter layer 45, and the upper surface of the etch stop layer 41 in the lower space 43H may be exposed. The upper surface of the top supporter layer 49 may be exposed.

On the upper portion of the first peripheral region MP, the first molding layer 43 may be removed, and the etch stop layer 41 may be exposed.

On the upper portion of the second cell region EC, the first molding layer 43 may remain under the middle supporter layer 45. The upper surface of the top supporter layer 49 may be exposed.

On the upper portion of the second peripheral region EP, the first molding layer 43 may be removed, and the etch stop layer 41 may be exposed.

Figure 28:
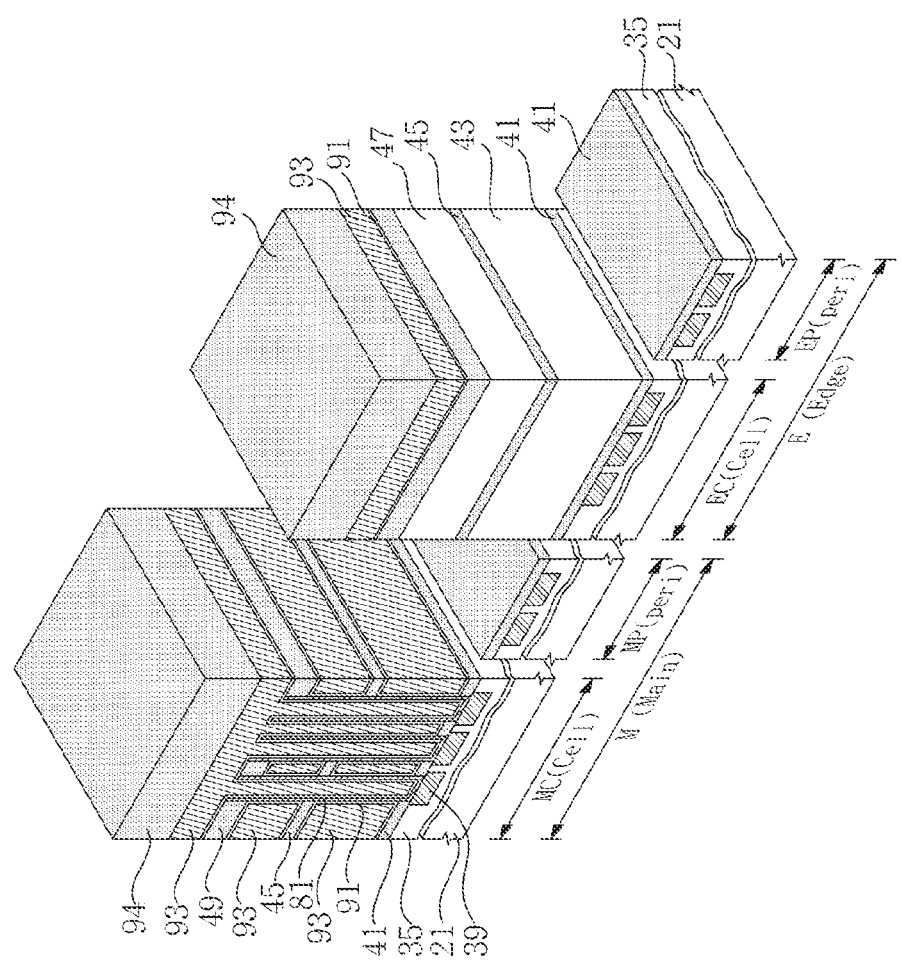

Referring to FIG. 28, a capacitor dielectric layer 91 may be formed (B60). Upper electrodes 93 and 94 may be formed (B62). A thin film forming process and a patterning process may be applied to the formation of the capacitor dielectric layer 91 and the upper electrodes 93 and 94.

The capacitor dielectric layer 91 may include a high-K dielectric layer, silicon oxide, silicon nitride, silicon oxynitride, or a combination thereof. The upper electrodes 93 and 94 may include a first upper electrode layer 93 and a second upper electrode layer 94 formed on the first upper electrode layer 93. The first upper electrode layer 93 may include a conductive material such as a metal, a metal nitride, a metal oxide, conductive carbon, or a combination thereof. The first upper electrode layer 93 may include Ti, TiN, TiAlN, TiCN, Ta, TaN, TaAlN, TaCN, W, WN, Ru, Pt, or a combination thereof. The second upper electrode layer 94 may include a conductive material such as a metal silicide layer or a semiconductor layer. The second upper electrode layer 94 may include a SiGe layer.

On the upper portion of the first cell region MC, the capacitor dielectric layer 91 may cover exposed surfaces of the lower electrodes 81, the etch stop layer 41, the middle supporter layer 45, and the top supporter layer 49 to have a uniform thickness. The middle supporter layer 45 and the top supporter layer 49 may be directly in contact with side surfaces of the lower electrodes 81. The capacitor dielectric layer 91 may be directly in contact with the upper surfaces and the lower surfaces of the middle supporter layer 45 and the top supporter layer 49. The upper electrodes 93 and 94 may fill the lower spaces 43H, the middle supporter openings 45H, the upper spaces 47H, the top supporter opening 49H, and the storage holes 79H, and cover the top supporter layer 49. The first upper electrode layer 93 may cover the capacitor dielectric layer 91. The capacitor dielectric layer 91 may be interposed between the first upper electrode layer 93 and the lower electrodes 81, between the first upper electrode layer 93 and the top supporter layer 49, between the first upper electrode layer 93 and the middle supporter layer 45, and between the first upper electrode layer 93 and the etch stop layer 41.

On the upper portion of the first peripheral region MP, the upper electrodes 93 and 94 may be removed by a patterning process, and the etch stop layer 41 may be exposed.

On the upper portion of the second cell region EC, the capacitor dielectric layer 91 and the upper electrodes 93 and 94 may be sequentially stacked on the top supporter layer 49. The upper end of the second cell region EC may be exposed at substantially the same level as the upper end of the first cell region MC.

On the upper portion of the second peripheral region EP, the upper electrodes 93 and 94 may be removed by a patterning process, and the etch stop layer 41 may be exposed. The upper end of the second peripheral region EP may be exposed at substantially the same level as the upper end of the first peripheral region MP.

Figure 29:
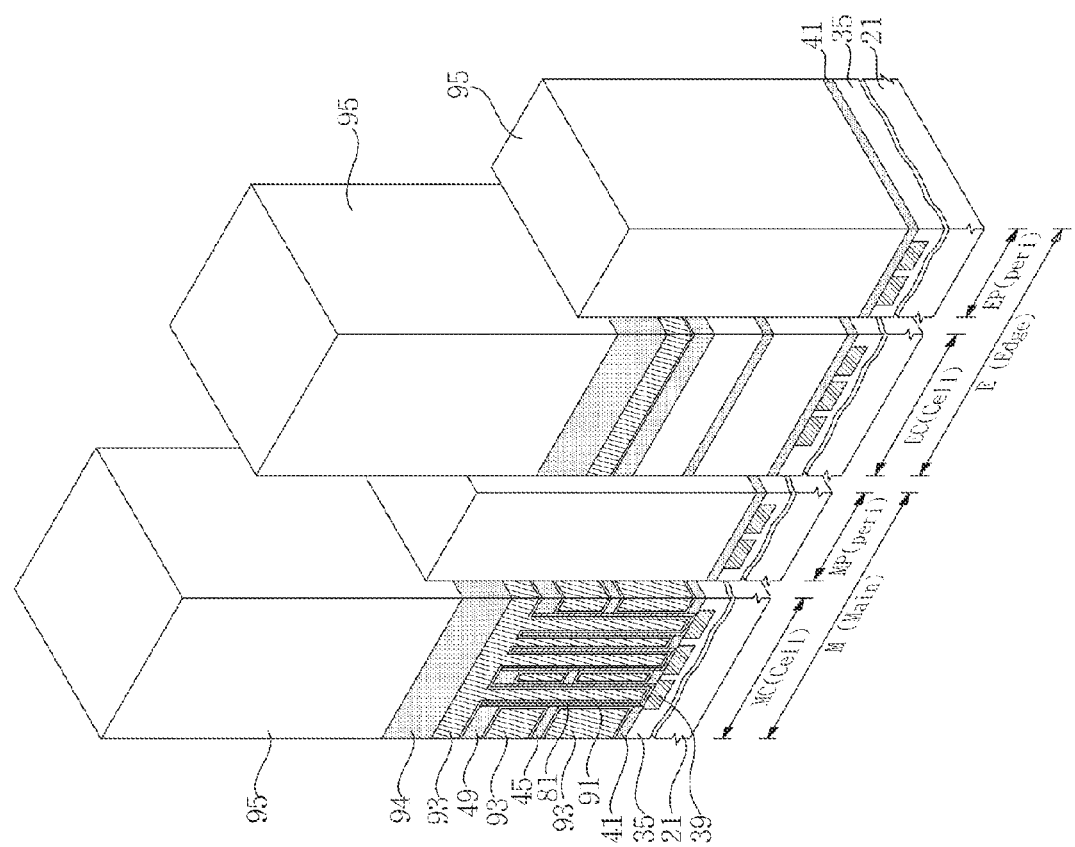

Referring to FIG. 29, an interlayer insulating layer 95 may be formed (B70). The interlayer insulating layer 95 may include a low-K dielectric layer, silicon oxide, silicon nitride, silicon oxynitride, or a combination thereof. For example, the interlayer insulating layer 95 may include TEOS.

The upper end of the first cell region MC may be formed at a higher level than the upper end of the first peripheral region MP. The upper end of the second cell region EC may be formed at a higher level than the upper end of the second peripheral region EP. The upper end of the second cell region EC may be exposed at substantially the same level as the upper end of the first cell region MC. The upper end of the second peripheral region EP may be exposed at substantially the same level as the upper end of the first peripheral region MP.

According to example embodiments of inventive concepts, a process using the second edge blocking layer 87 may be interpreted as a second PSES process. A reticle including both of a light projection pattern and a light shielding pattern may be used to form the second edge blocking layer 87. The reticle used to form the second edge blocking layer 87 may include light projection patterns which expose the upper portion of the second cell region EC and light shielding patterns which shield the upper portion of the second peripheral region EP. On the edge chip E and the main chip M, a stepped surface of the interlayer insulating layer 95 may have a very uniform distribution. A stepped surface of the interlayer insulating layer 95 on the edge chip E may be substantially the same as a stepped surface of the interlayer insulating layer 95 on the main chip M. The stepped surface of the interlayer insulating layer 95 having a uniform distribution through an entire surface of the substrate 21 may make a planarization process of the interlayer insulating layer 95 very easy.

Figure 30:
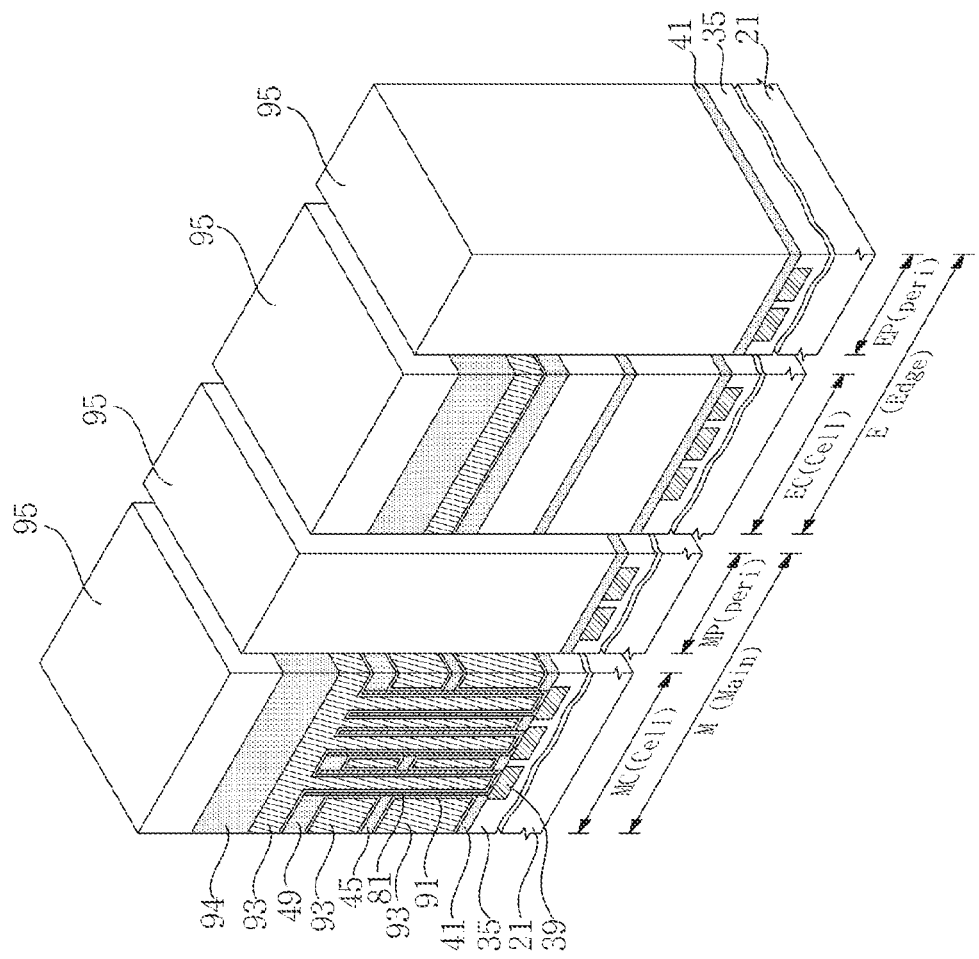

Referring to FIG. 30, the interlayer insulating layer 95 may be planarized (B75). A chemical mechanical polishing (CMP) process may be applied to the planarization of the interlayer insulating layer 95. The upper surfaces of the first cell region MC, the first peripheral region MP, the second cell region EC, and the second peripheral region EP may be exposed at substantially the same level.

Figure 31:
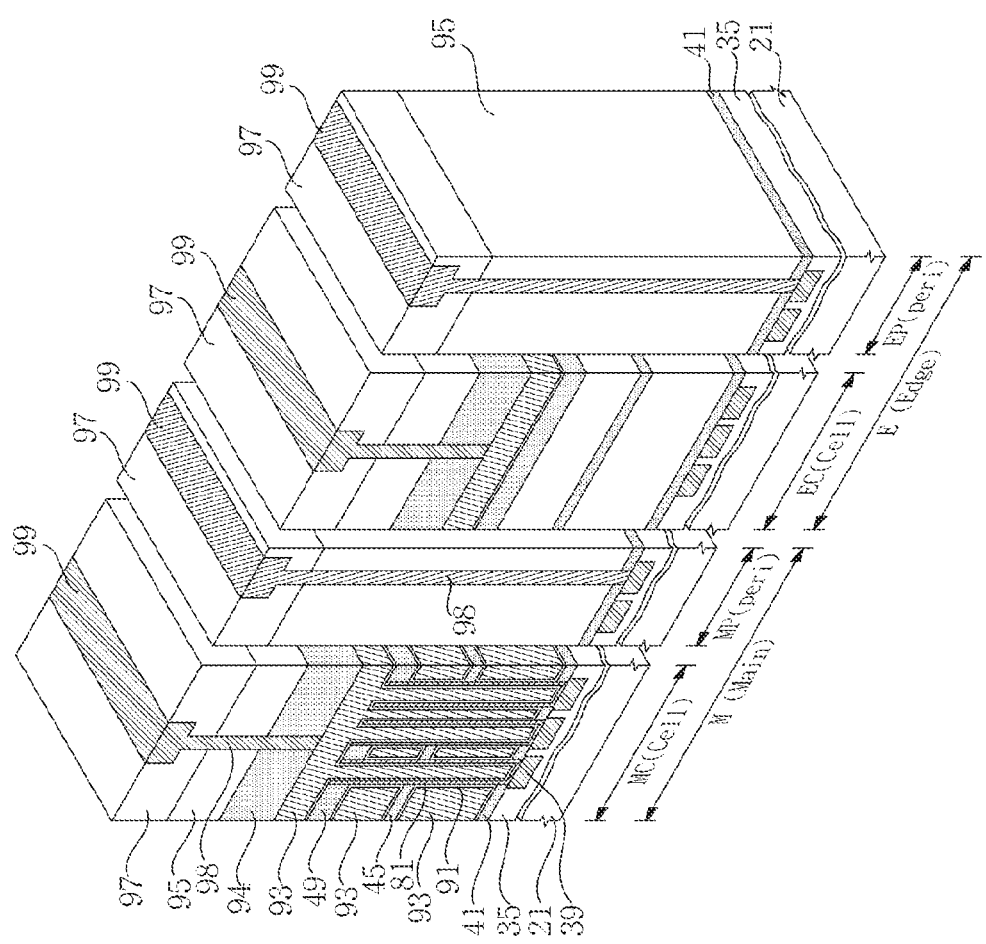

Referring to FIG. 31, an upper insulating layer 97 may be formed on the interlayer insulating layer 95. Interconnections 98 and 99 may be formed in the upper insulating layer 97 (B80).

The upper insulating layer 97 may include a low-K dielectric layer, silicon oxide, silicon nitride, silicon oxynitride, or a combination thereof. The interconnections 98 and 99 may include a plug 98 and an upper interconnection 99. Each of the interconnections 98 and 99 may include Cu, Al, Ni Co, Fe, Ti, TiN, TiAlN, TiCN, Ta, TaN, TaAlN, TaCN, W, WN, Ru, Pt, or a combination thereof.

Figure 32:
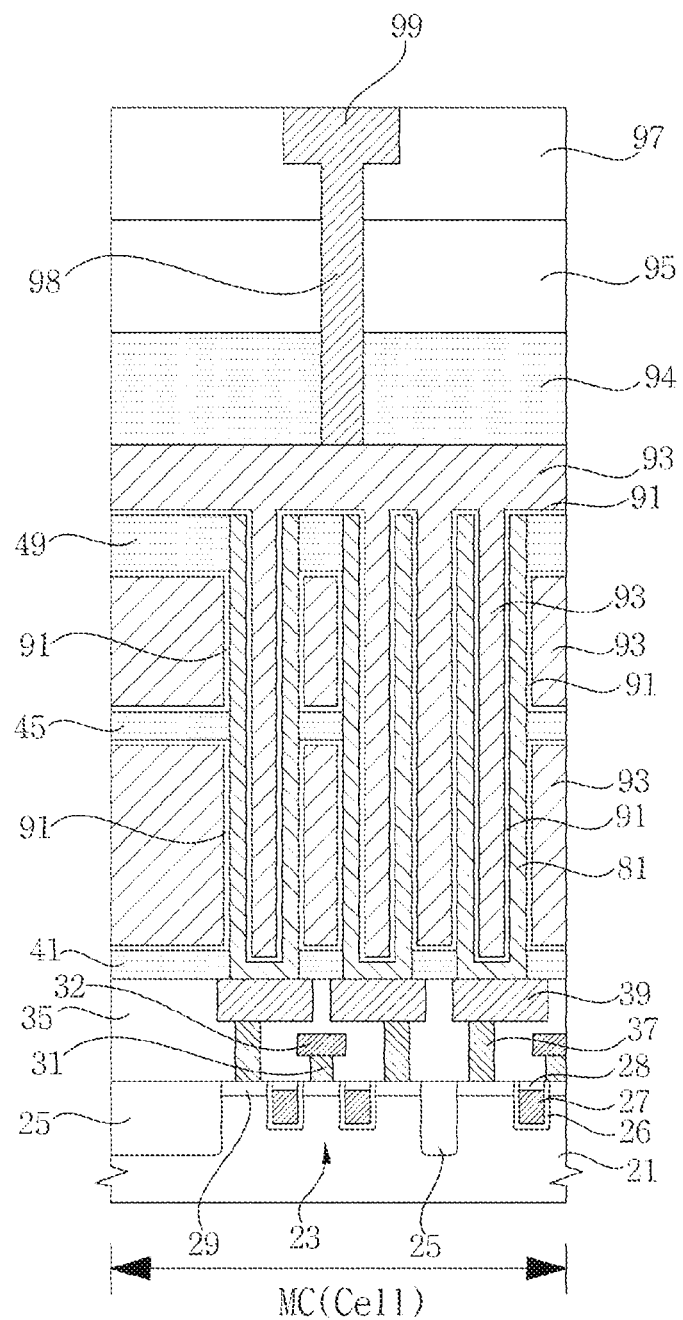
FIG. 32 is a cross-sectional view for describing a method of forming a semiconductor device in accordance with example embodiments of inventive concepts.

FIG. 32 is a cross-sectional view for describing a method of forming a semiconductor device in accordance with example embodiments of inventive concepts.

Referring to FIG. 32, active areas 23, an isolation layer 25, a gate dielectric layer 26, gate electrodes 27, a gate capping layer 28, a source/drain area 29, bit plugs 31, bit lines 32, a lower insulating layer 35, buried plugs 37, landing pads 39, an etch stop layer 41, a middle supporter layer 45, a top supporter layer 49, lower electrodes 81, a capacitor dielectric layer 91, upper electrodes 93 and 94, an interlayer insulating layer 95, an upper insulating layer 97, and interconnections 98 and 99 may be formed on a substrate 21.

Figure 33:
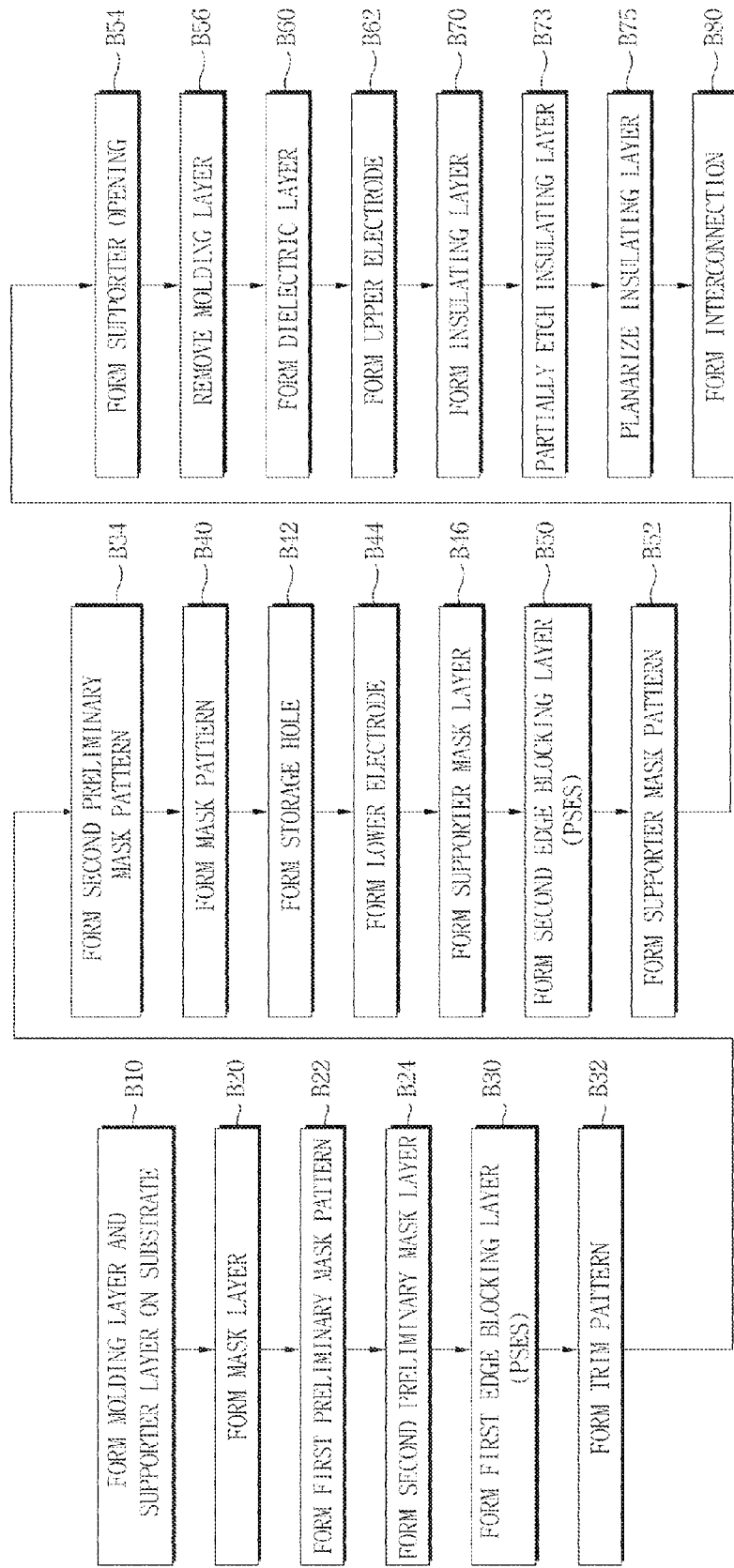
FIG. 33 is a flowchart for describing a method of forming a semiconductor device in accordance with example embodiments of inventive concepts.

FIG. 33 is a flowchart for describing a method of forming a semiconductor device in accordance with example embodiments of inventive concepts. FIGS. 34 to 37 are perspective views for describing the method of forming the semiconductor device in accordance with example embodiments of inventive concepts.

Referring to FIG. 33, the method of forming the semiconductor device in accordance with example embodiments of inventive concepts may include forming a molding layer and a supporter layer on a substrate (B10), forming a mask layer (B20), forming a first preliminary mask pattern (B22), forming a second preliminary mask layer (B24), forming a first edge blocking layer (B30), forming a trim pattern (B32), forming a second preliminary mask pattern (B34), forming a mask pattern (B40), forming a storage hole (B42), forming a lower electrode (B44), forming a supporter mask layer (B46), forming a second edge blocking layer (B50), forming a supporter mask pattern (B52), forming a supporter opening (B54), removing the molding layer (B56), forming a dielectric layer (B60), forming an upper electrode (B62), forming an insulating layer (B70), partially etching the insulating layer (B73), planarizing the insulating layer (B75), and forming an interconnection (B80). Hereinafter, only differences from the embodiment described with reference to FIGS. 1 to 32 will be briefly described.

Figure 34:
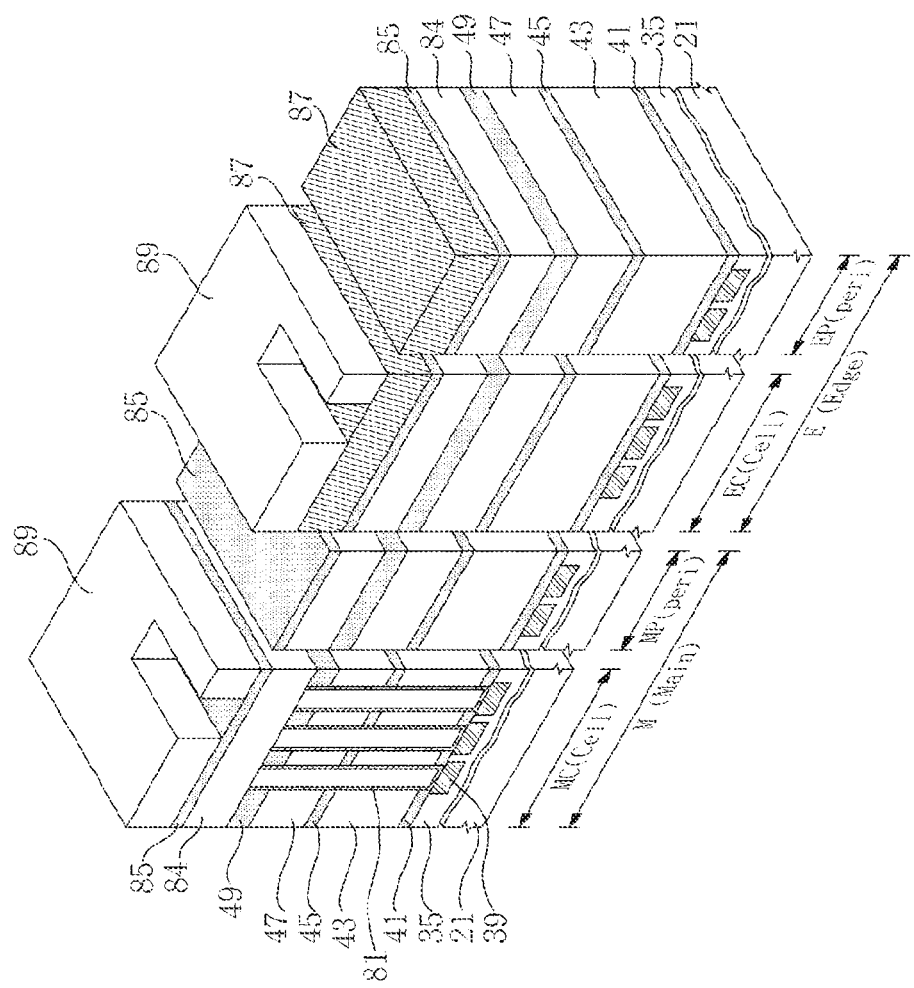
FIGS. 34 to 37 are perspective views for describing the method of forming a semiconductor device in accordance with example embodiments of inventive concepts.

Referring to FIG. 34, a second edge blocking layer 87 may be formed on a fifth ARC layer 85 (B50). A process using the second edge blocking layer 87 may be interpreted as a second PSES process. Third photo mask patterns 89 may be formed.

The second edge blocking layer 87 may include a negative photoresist. A reticle having a light projection pattern may be used to form the second edge blocking layer 87. The second edge blocking layer 87 may completely cover the second cell region EC and the second peripheral region EP, and expose the fifth ARC layer 85 on the first cell region MC and the first peripheral region MP.

Figure 35:
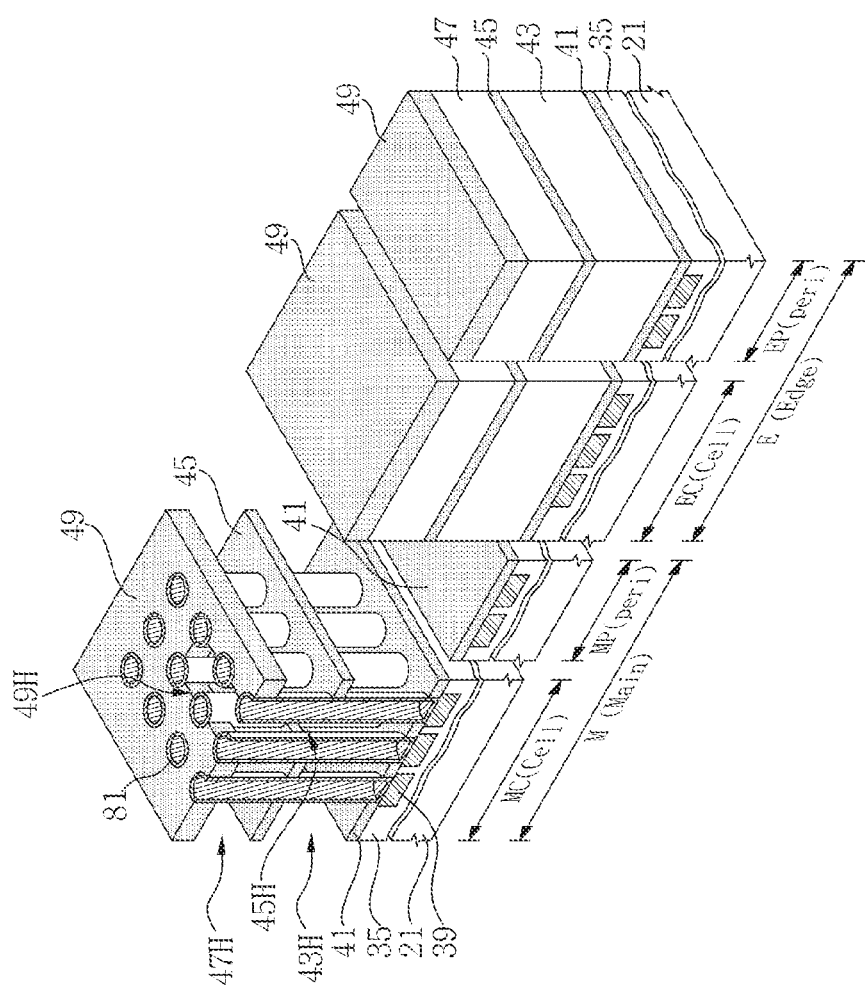

Referring to FIG. 35, on the upper portion of the first cell region MC, the first molding layer 43 may be removed, and the etch stop layer 41 may be exposed. Side surfaces of the lower electrode 81, a lower surface of the middle supporter layer 45, and an upper surface of the etch stop layer 41 in the lower spaces 43H may be exposed. The upper surface of the top supporter layer 49 may be exposed.

On the upper portion of the first peripheral region MP, the first molding layer 43 may be removed, and the etch stop layer 41 may be exposed.

On the upper portion of the second cell region EC, the first molding layer 43 may remain under the middle supporter layer 45. The upper surface of the top supporter layer 49 may be exposed.

On the upper portion of the second peripheral region EP, the first molding layer 43 may remain under the middle supporter layer 45. The upper surface of the top supporter layer 49 may be exposed. The upper end of the second peripheral region EP may be exposed on substantially the same plane as the upper end of the second cell region EC.

Figure 36:
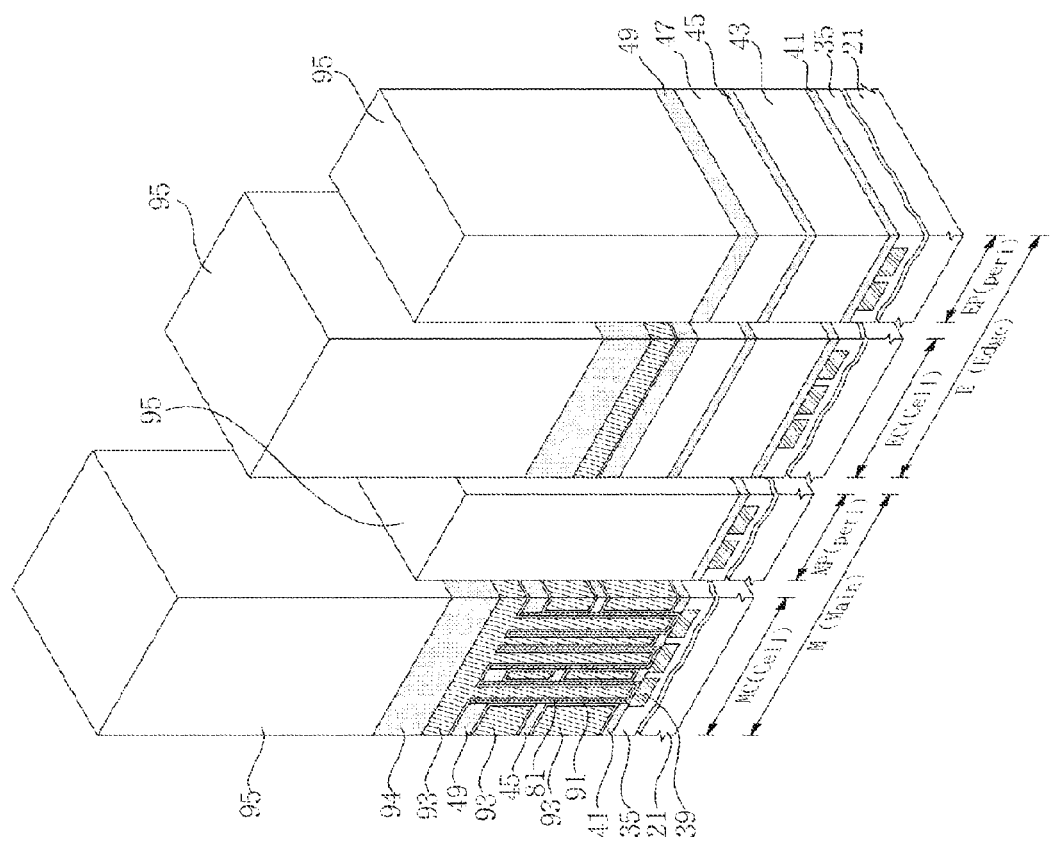

Referring to FIG. 36, an interlayer insulating layer 95 may be formed (B70).

The upper end of the first cell region MC may be formed at a higher level than the upper end of the first peripheral region MP. The upper end of the second cell region EC may be formed at a higher level than the upper end of the second peripheral region EP. The upper end of the second cell region EC may be exposed at substantially the same level as the upper end of the first cell region MC. The upper end of the second peripheral region EP may be formed at a higher level than the upper end of the first peripheral region MP.

Figure 37:
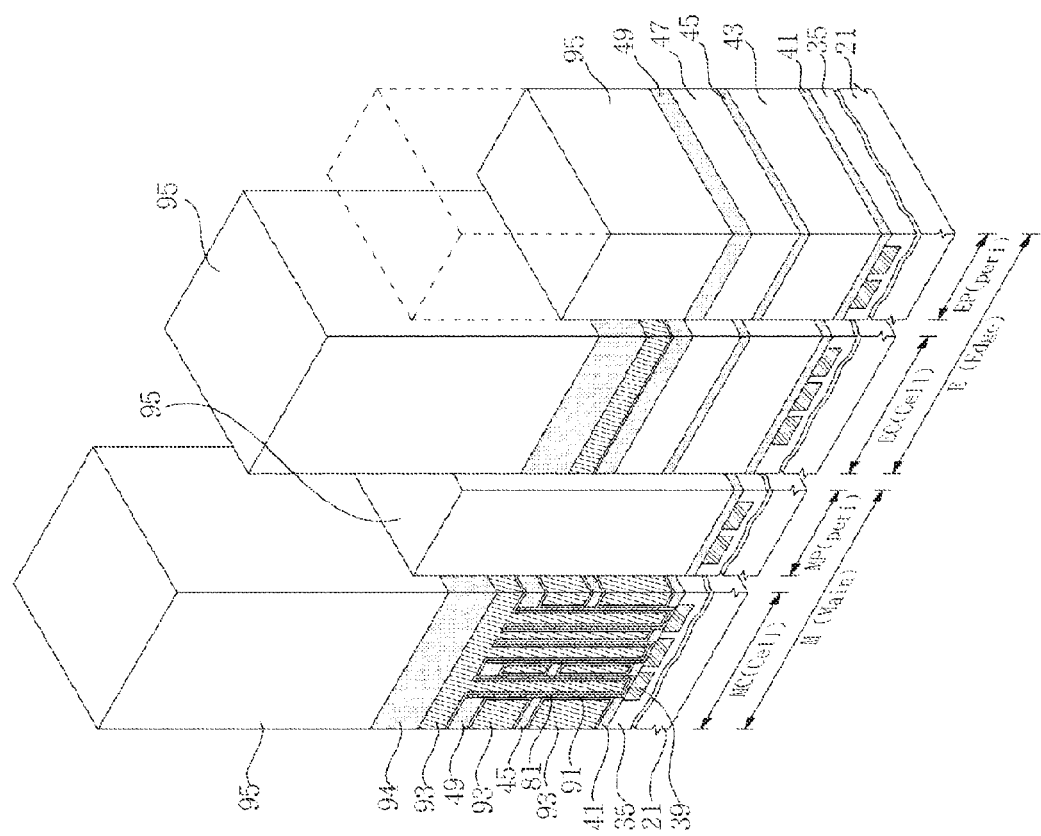

Referring to FIG. 37, the interlayer insulating layer 95 on the second peripheral region EP may be recessed using a patterning process. The upper surface of the recessed interlayer insulating layer 95 may be exposed at substantially the same level as the upper end of the first peripheral region MP.

According to example embodiments of inventive concepts, patterns such as storage holes and lower electrodes can be limited (and/or prevented) from being formed on an edge chip of a semiconductor substrate by performing a PSES process once while performing a photolithography process three times. Further, a second PSES process is performed in the formation of a top supporter opening. A stepped surface of an interlayer insulating layer on the edge chip can be substantially the same as a stepped surface of an interlayer insulating layer on a main chip. A stepped surface of the interlayer insulating layer uniformly distributed on an entire surface of the semiconductor substrate can make planarization very easy. Therefore, the semiconductor device having an excellent electrical characteristic can be formed.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:
1. A semiconductor device, comprising:
a substrate including a main chip and an edge chip,
the edge chip being nearer an edge of the substrate than the main chip,
the main chip including a first cell region and a first peripheral region, and the edge chip including a second cell region and a second peripheral region;
landing pads formed on the substrate;
an etch stop layer on the landing pads;
a supporter layer on the etch stop layer, the supporter layer not being on the first peripheral region;
a lower electrode passing through the supporter layer and the etch stop layer, the lower electrode being in contact with the landing pads,
the lower electrode being on the first cell region, and
the lower electrode not being on the first peripheral region, the second cell region and the second peripheral region;
a molding layer between the etch stop layer and the supporter layer, the molding layer not being on the first cell region and the first peripheral region;
a capacitor dielectric layer on the lower electrode;
an upper electrode on the capacitor dielectric layer; and
an interlayer insulating layer covering the etch stop layer and the upper electrode.

2. The device according to claim 1, wherein a lower surface of the interlayer insulating layer on the first cell region and a lower surface of the interlayer insulating layer on the second cell region are formed at substantially the same level.

3. The device according to claim 1, wherein
the upper electrode is on the supporter layer over the second cell region, and
an upper surface of the upper electrode on the second cell region is at substantially the same level as an upper surface of the upper electrode on the first cell region.

4. The device according to claim 1, wherein:
the supporter layer is on the first cell region and the second cell region;
the molding layer is between the etch stop layer and the supporter layer on the second cell region; and
the molding layer and the supporter layer are not on the second peripheral region.

5. The device according to claim 4, wherein:
the interlayer insulating layer on the first peripheral region directly contacts the etch stop layer;
the interlayer insulating layer on the second peripheral region directly contacts the etch stop layer; and
a lower surface of the interlayer insulating layer on the first peripheral region and a lower surface of the interlayer insulating layer on the second peripheral region are formed at substantially the same level.

6. The device according to claim 1, wherein:
the supporter layer is on the first cell region, the second cell region, and the second peripheral region;
the molding layer is between the etch stop layer and the supporter layer on the second cell region; and
the molding layer is between the etch stop layer and the supporter layer on the second peripheral region.

7. The device according to claim 6, wherein:
the interlayer insulating layer on the first peripheral region directly contacts the etch stop layer;
the interlayer insulating layer on the second peripheral region directly contacts the supporter layer; and
a lower surface of the interlayer insulating layer on the second peripheral region is formed at a higher level than a lower surface of the interlayer insulating layer on the first peripheral region.

8. The device according to claim 1, wherein:
the supporter layer directly contacts the lower electrode;
the upper electrode extends between the supporter layer and the interlayer insulating layer;
the capacitor dielectric layer is between the upper electrode and the lower electrode, and
the capacitor dielectric layer is between the upper electrode and the supporter layer.

9. The device according to claim 1, wherein the supporter layer includes:
a top supporter layer; and
a middle supporter layer, wherein
the middle supporter layer is between the top supporter layer and the etch stop layer,
the capacitor dielectric layer is in contact with an upper surface of the top supporter layer, a lower surface of the top supporter layer, an upper surface of the middle supporter layer, a lower surface of the middle supporter layer, and an upper surface of the etch stop layer.

* * * * *